(12) United States Patent
Kang et al.

(10) Patent No.: US 11,437,335 B2
(45) Date of Patent: Sep. 6, 2022

(54) INTEGRATED CIRCUIT (IC) PACKAGES EMPLOYING A THERMAL CONDUCTIVE PACKAGE SUBSTRATE WITH DIE REGION SPLIT, AND RELATED FABRICATION METHODS

(71) Applicant: QUALCOMM Incorporated, San Diego, CA (US)

(72) Inventors: Kuiwon Kang, San Diego, CA (US);
Aniket Patil, San Diego, CA (US);
Bohan Yan, San Diego, CA (US);
Dongming He, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/921,152

(22) Filed: Jul. 6, 2020

(65) Prior Publication Data

US 2021/0242160 A1    Aug. 5, 2021

Related U.S. Application Data

(60) Provisional application No. 62/969,706, filed on Feb. 4, 2020.

(51) Int. Cl.
*H01L 23/00* (2006.01)
*H01L 23/532* (2006.01)
*H01L 23/367* (2006.01)

(52) U.S. Cl.
CPC .......... *H01L 24/24* (2013.01); *H01L 23/3672* (2013.01); *H01L 23/53295* (2013.01); *H01L 24/19* (2013.01)

(58) Field of Classification Search
CPC ................ H01L 24/24; H01L 23/3672; H01L 23/53295; H01L 24/19
See application file for complete search history.

(56) References Cited

U.S. PATENT DOCUMENTS 6,265,307 B1 * 7/2001 Lou ................... H01L 21/02362
438/618
2012/0146193 A1    6/2012 Stuber et al.
(Continued)

OTHER PUBLICATIONS

International Search Report and Written Opinion—PCT/US2020/063935—ISA/EPO—dated Apr. 6, 2021.

*Primary Examiner* — Fernando L Toledo
*Assistant Examiner* — Neil R Prasad
(74) *Attorney, Agent, or Firm* — Qualcomm Incorporated

(57) ABSTRACT

Integrated circuit (IC) packages employing a thermal conductive semiconductor package substrate with die region split and related fabrication methods are disclosed. The package substrate includes a die split where metal contacts in one or more dielectric layers of the package substrate underneath the IC die(s) are thicker (e.g., in a core die region) than other metal contacts (e.g., in a peripheral die region) in the dielectric layer. This facilitates higher thermal dissipation from the IC die(s) through the thicker metal contacts in the package substrate. Cross-talk shielding of the package substrate may not be sacrificed since thinner metal contacts of the package substrate that carry high speed signaling can be of lesser thickness than the thicker metal contacts that provide higher thermal dissipation. The dielectric layer in the package substrate may also include dielectric materials having different thermal conductivities to further facilitate thermal dissipation and/or desired electrical or mechanical characteristics.

29 Claims, 16 Drawing Sheets

(56) References Cited

U.S. PATENT DOCUMENTS

| | | | |
|---|---|---|---|
| 2014/0048906 A1* | 2/2014 | Shim | H01L 23/49816 |
| | | | 257/532 |
| 2014/0246757 A1 | 9/2014 | Daley et al. | |
| 2017/0062714 A1 | 3/2017 | Kau | |
| 2017/0229367 A1* | 8/2017 | Ge | H01L 21/76877 |
| 2019/0182997 A1 | 6/2019 | Lin et al. | |
| 2021/0202347 A1* | 7/2021 | Lift | H01L 23/481 |

* cited by examiner

INTEGRATED CIRCUIT (IC) PACKAGES EMPLOYING A THERMAL CONDUCTIVE PACKAGE SUBSTRATE WITH DIE REGION SPLIT, AND RELATED FABRICATION METHODS

PRIORITY CLAIM

The present application claims priority to U.S. Provisional Patent Application Ser. No. 62/969,706 filed on Feb. 4, 2020 and entitled "INTEGRATED CIRCUIT (IC) PACKAGES EMPLOYING A THERMAL CONDUCTIVE PACKAGE SUBSTRATE WITH DIE REGION SPLIT, AND RELATED FABRICATION METHODS," the contents of which is incorporated herein by reference in its entirety.

BACKGROUND

I. Field of the Disclosure

The field of the disclosure relates to package substrates included in a chip package to provide electrical connections between an integrated circuit (IC) chip(s) and a circuit board, and more particularly to dissipation of heat from the IC chip(s) through the package substrate.

II. Background

Integrated circuits (ICs) are the cornerstone of electronic devices. ICs are packaged in an IC package also called a "semiconductor package" or "chip package." The IC package includes one or more semiconductor dice as an IC(s) that are mounted on and electrically coupled to a package substrate to provide physical support and an electrical interface to the semiconductor die(s). The package substrate may be an embedded trace substrate (ETS), for example, that includes embedded electrical traces in one or more dielectric layers and vertical interconnects coupling the electrical traces together to provide electrical interfaces between the semiconductor die(s). The semiconductor die(s) is mounted to and electrically interfaced to interconnects exposed in a top layer of the package substrate to electrically couple the semiconductor die(s) to the electrical traces of the package substrate. The semiconductor die(s) and package substrate are encapsulated in a package material, such as a molding compound, to form the IC package. The IC package may also include external solder balls that are electrically coupled to interconnects exposed in a bottom layer of the package substrate to electrically couple the solder balls to the electrical traces in the package substrate. The solder balls provide an external electrical interface to the semiconductor die(s) in the IC package, The solder balls are electrically coupled to metal contacts on a printed circuit board (PCB) when the IC package is mounted to the PCB to provide an electrical interface between electrical traces in the PCB to the IC chip through the package substrate in the IC package.

Advances in the electrical performance of silicon ICs have resulted in ever-shrinking IC dice. However, as the area of the IC dice grow smaller, the power consumption, and thus the power density across the die, increases. Increased power density across the die directly translates to an increase in the amount of heat produced by the die. As semiconductor junction temperatures go up, carrier mobility decreases, which degrades the performance of transistors and other electrical components of the IC. For example, a sustained elevated temperature in an IC die that increases semiconductor junction temperatures can result in a substantial reduction of the lifespan of the IC. Moreover, increased IC die temperatures may be problematic from a consumer use standpoint for certain types of electronic devices. For example, handheld consumer devices, such as mobile phones, laptops, tablet computers, electronic readers, smartphones, etc., cannot exceed specific temperatures along surfaces that may be touched by a user in order to safeguard the user from burns.

Thus, heat dissipation in an IC has become a very important consideration to prevent IC dice from operating at elevated temperatures that can affect IC performance and reliability. Heat spreaders can be employed to dissipate heat, but heat spreaders may not be practical in small form factor IC packages due to size constraints. FIG. 1 illustrates a schematic view of a cross-section of a flip-chip IC package 100 ("IC package 100") that does not include a heat spreader. The IC package 100 includes a semiconductor die 102 ("IC die 102") having a front surface 104 (i.e., active surface) that is coupled to a package substrate 106 via a die attach and/or underfill adhesive 108. An epoxy and/or resin molding compound 110 may also be used to stabilize and protect the IC die 102. Solder bumps 112 are formed on the bottom surface 114 of the package substrate 106 to provide an electrical interface to the IC die 102 when the IC package 100 is mounted to a printed circuit board (PCB). The IC die 102 may have on-chip thermal sensors and control logic that help control the IC package's 100 power consumption and resulting generated heat 116 by using dynamic thermal management techniques. However, these dynamic thermal management techniques may limit the operational frequency of the IC die 102 in order to keep the IC die 102 cool, thereby sacrificing performance of the IC package 100. Thermal management techniques may also affect the life span of the IC package 100 as changes in temperature can cause the IC die 102 to expand and contract and introduce thermal stresses in the IC die 102. Thus, there is a need for improved passive thermal management systems, methods, and devices that adequately dissipate heat generated by an IC in an IC package without negatively affecting the performance of the IC.

SUMMARY OF THE DISCLOSURE

Aspects disclosed herein include integrated circuit (IC) packages employing a thermal conductive semiconductor package substrate with die region split. Related chip packages and methods of fabricating the semiconductor package substrate with die region split are also disclosed. An IC package is provided that includes one or more semiconductor dice, also referred to as "IC die," mounted on a package substrate. Die interconnects (e.g., core solder bumps) on a bottom surface of the semiconductor die(s) are electrically coupled to substrate interconnects exposed on a top surface of a package substrate to electrically couple the ICs in the IC die to the electrical traces in the package substrate. The package substrate includes one or more dielectric layers that contain one or more routing layers of electrical traces that can be electrically coupled to electrical traces in an adjacent dielectric layer through vertical interconnects, such as vertical accesses (vias), for example. The electrical traces are coupled to substrate interconnects exposed on a bottom surface of the package substrate that are electrically coupled to electrical joints (e.g., solder balls) that are exposed from the packaging material encapsulating the IC die(s) and package substrate as part of the IC package and provide an external electrical interface to the IC die(s) when mounted to a printed circuit board (PCB).

The electrical traces in the package substrate of the IC package not only provide electrical interface to the IC die(s), but can also act to dissipate heat generated by the IC die(s) when powered and in operation. The IC die(s) includes a core die region where core integrated circuits ("core circuits") are formed. Core circuits can include hard circuit macros, such as a computer processing unit (CPU), graphics processor unit (GPU) memory, a modem, and/or core power distribution rails, as examples. The IC die(s) also includes a peripheral die region outside of the core die region in a non-core or peripheral region that includes peripheral circuits such as input/output (I/O) circuits and electrical routing traces, as examples, to provide interfaces to the core circuits. The core circuits typically generate more heat than the peripheral circuits. In this regard, to facilitate improved heat dissipation from the core circuits of the IC die(s), in exemplary aspects disclosed herein, at least one dielectric layer of the package substrate contains a die region split between its metal contacts for electrical traces. One or more metal contacts of electrical traces in a dielectric layer underneath the IC die(s) in a height direction (i.e., a Z-axis direction) are thicker in the height direction than other metal contacts of electrical traces in the same dielectric layer. In this manner, as an example, the IC package may have a more effective thermal (i.e., heat) dissipation for heat generated from the IC die(s) through the thicker metal contacts of electrical traces of the dielectric layer(s) of the package substrate. For example, this can offset reduced heat dissipation that may occur otherwise if the IC package and its package substrate were reduced in height, and thus reduce the volume of the metal contacts of electrical traces in the package substrate, to facilitate the IC package height reduction.

As one non-limiting example, one or more metal contacts of electrical traces in a dielectric layer underneath the core die region of the IC die(s) can be fabricated to be taller in the height direction than metal contacts of electrical traces in the same dielectric layer underneath the peripheral die region of the IC die(s). In this manner, as an example, the IC package may have a more effective thermal (i.e., heat) dissipation for heat generated from the core circuits in the IC die(s) through the thicker metal contacts of electrical traces in the core die region of the dielectric layer(s) of the package substrate. By providing the die core split in the package substrate, metal contacts of electrical traces in the peripheral die region of the dielectric layer in the package substrate can still be sized to be of less thickness than in the core die region of the dielectric layer to facilitate cross-talk shielding, as an example, Thus, heat dissipation from the IC die(s) through the core die region of the package substrate may not be sacrificed to still facilitate cross-talk shielding in the peripheral die region of the package substrate.

To further facilitate thermal dissipation from the IC die(s) in the IC package, a dielectric layer in the package substrate that contains thicker metal contacts of electrical traces may also include a dielectric material that has a higher thermal conductivity (e.g., in Watts per meter (m) Kelvin (K) (W/mK)) than a dielectric material disposed adjacent to and/or surrounding the shorter metal contacts in the dielectric layer, For example, a dielectric layer in the package substrate that contains thicker metal contacts of electrical traces in a core die region than in its peripheral die region may also include a dielectric material that has a higher thermal conductivity in its core die region than the thermal conductivity of a dielectric material in its peripheral die region. A dielectric material having a higher thermal conductivity facilitates increased thermal transfer versus a dielectric material having a lower thermal conductivity. As an example, dielectric material in the peripheral die region of the dielectric layer can be of a different dielectric material than in the core die region of the dielectric layer and selected based on desired electrical characteristics, such as signaling speed, and/or mechanical characteristics, such as less susceptibility to thermal stress. In this regard, in one exemplary aspect, an integrated circuit (IC) package is provided. The IC package includes a substrate disposed in a horizontal plane, the substrate including a first dielectric material having a first thermal conductivity, a second dielectric material having a second thermal conductivity lower than the first thermal conductivity, and a routing layer. The routing layer includes one or more first metal contacts disposed adjacent to the first dielectric material, the one or more first metal contacts each having a first height in a height direction orthogonal to the horizontal plane. The routing layer further includes one or more second metal contacts disposed adjacent to the second dielectric material, the one or more second metal contacts each having a second height in the height direction, the second height less than the first height.

In another aspect, a method of fabricating a package substrate for an integrated circuit (IC) package is provided. The method includes forming a substrate disposed in a horizontal plane. The method further includes forming a dielectric layer, including forming a first dielectric material having a first thermal conductivity, forming a second dielectric material having a second thermal conductivity lower than the first thermal conductivity, and forming a routing layer. The method of forming the routing layer father includes forming one or more first metal contacts adjacent to the first dielectric material, the one or more first metal contacts each having a first height in a height direction orthogonal to the horizontal plane, and forming one or more second metal contacts adjacent to the second dielectric material, the one or more second metal contacts each having a second height in the height direction, the second height less than the first height.

DETAILED DESCRIPTION

Figure 1:
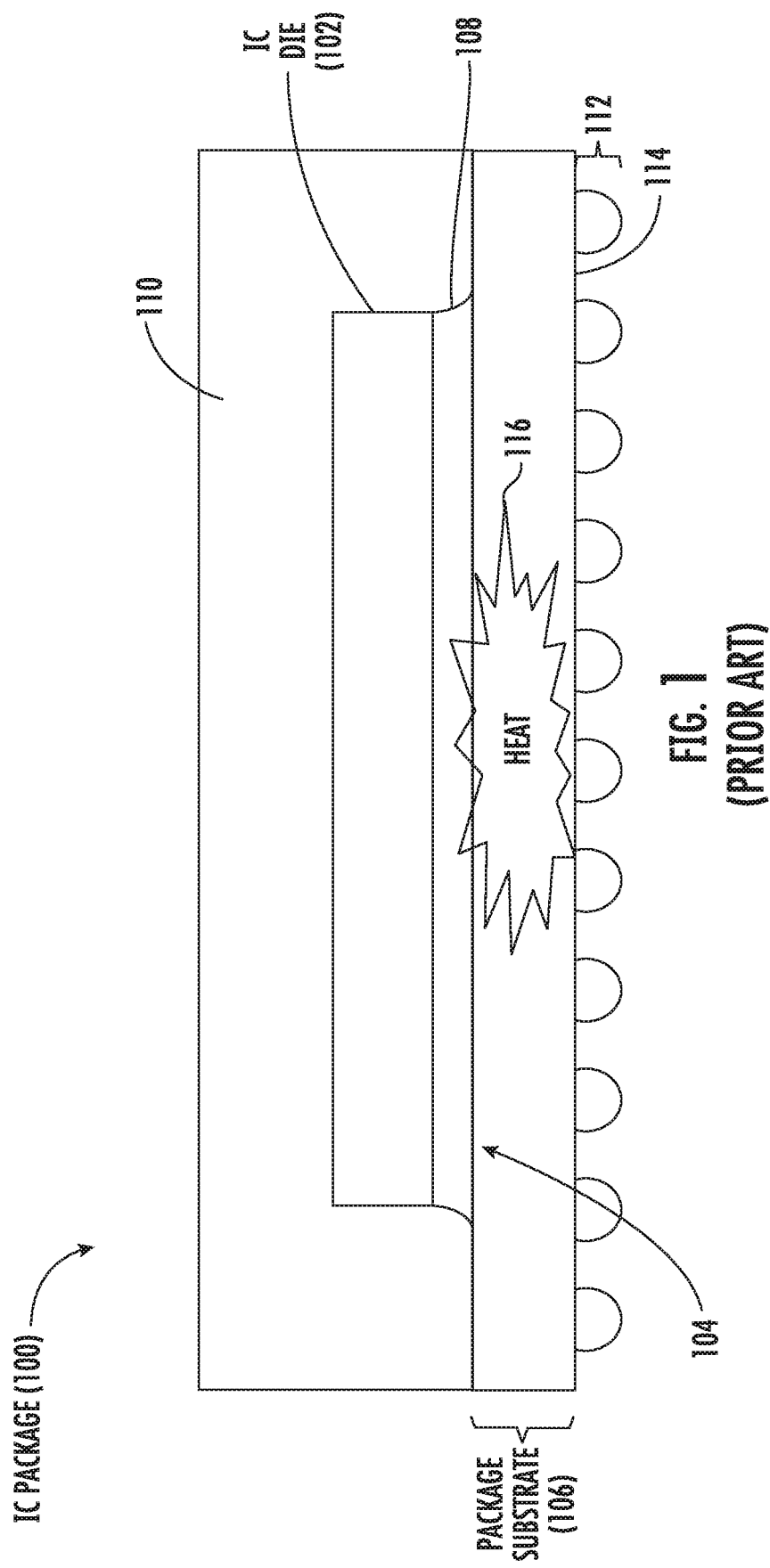
FIG. 1 is a side view of an exemplary flip-chip integrated circuit (IC) package includes an encapsulated semiconductor die mounted on and electrically coupled to a package substrate.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrated circuit (IC) packages employing a thermal conductive semiconductor package substrate with die region split. Related chip packages and methods of fabricating the semiconductor package substrate with die region split are also disclosed. An IC package is provided that includes one or more semiconductor dice, also referred to as "IC die," mounted on a package substrate. Die interconnects (e.g., core solder bumps) on a bottom surface of the semiconductor die(s) are electrically coupled to substrate interconnects exposed on a top surface of a package substrate to electrically couple the ICs in the IC die to the electrical traces in the package substrate. The package substrate includes one or more dielectric layers that contain a routing layer of electrical traces that can be electrically coupled to electrical traces in an adjacent dielectric layer through vertical interconnects, such as vertical interconnect accesses (vias), for example. The electrical traces are coupled to substrate interconnects exposed on a bottom surface of the package substrate that are electrically coupled to electrical joints (e.g., solder balls) that are exposed from the packaging material encapsulating the IC die(s) and package substrate as part of the IC package and provide an external electrical interface to the IC die(s) when mounted to a printed circuit board (PCB).

The electrical traces in the package substrate of the IC package not only provide electrical interface to the IC die(s), but can also act to dissipate heat generated by the IC die(s) when powered and in operation. The IC die(s) includes a core die region where core integrated circuits ("core circuits") are formed. Core circuits include hard circuit macros, such as a computer processing unit (CPU), graphics processor unit (GPU), memory, a modem, and/or core power distribution rails, as examples. The IC die(s) also includes a peripheral die region outside of the core die region in a non-core or peripheral region that includes peripheral circuits such as input/output (I/O) circuits and electrical routing traces, as examples, to provide interfaces to the core circuits. The core circuits typically generate more heat than the peripheral circuits. In this regard, to facilitate improved heat dissipation from the core circuits of the IC die(s), in exemplary aspects disclosed herein, at least one dielectric layer of the package substrate contains a die region split between its metal contacts of electrical traces. In this regard, one or more metal contacts of electrical traces in a dielectric layer underneath the IC die(s) in a height direction (i.e., a Z-axis direction) are thicker in the height direction than other metal contacts of electrical traces in the same dielectric layer. In this manner, as an example, the IC package may have a more effective thermal (i.e., heat) dissipation for heat generated from the IC die(s) through the thicker metal contacts of electrical traces of the dielectric layer(s) of the package substrate. For example, this can offset reduced heat dissipation that may occur otherwise if the IC package and its package substrate were reduced in height, and thus reduce the volume of the metal contacts of electrical traces in the package substrate, to facilitate the IC package height reduction.

As one non-limiting example, one or more metal contacts of electrical traces in a dielectric layer underneath the core die region of the IC die(s) can be fabricated to be taller in the height direction than metal contacts of electrical traces in the same dielectric layer underneath the peripheral die region of the IC die(s). In this manner, as an example, the IC package may have a more effective thermal (i.e., heat) dissipation for heat generated from the core circuits in the IC die(s) through the thicker metal contacts of electrical traces in the core die region of the dielectric layer(s) of the package substrate. By providing the die core split in the package substrate, metal contacts of electrical traces in the peripheral die region of the dielectric layer in the package substrate can still be sized to be of less thickness than in the core die region of the dielectric layer to facilitate cross-talk shielding, as an example. Thus, heat dissipation from the IC die(s) through the core die region of the package substrate may not be sacrificed to still facilitate cross-talk shielding in the peripheral die region of the package substrate.

To further facilitate thermal dissipation from the IC die(s) in the IC package, a dielectric layer in the package substrate that contains thicker metal contacts of electrical traces may also include a dielectric material that has a higher thermal conductivity (e.g., in Watts per meter (m) Kelvin (K) (W/mK)) than a dielectric material disposed adjacent to and/or surrounding the shorter metal contacts in the dielectric layer. For example, a dielectric layer in the package substrate that contains thicker metal contacts of electrical traces in a core die region than in its peripheral die region may also include a dielectric material that has a higher thermal conductivity in its core die region than the thermal conductivity of a dielectric material in its peripheral die region. A dielectric material having a higher thermal conductivity facilitates increased thermal transfer versus a dielectric material having a lower thermal conductivity. As an example, dielectric material in the peripheral die region of the dielectric layer can be of a different dielectric material than in the core die region of the dielectric layer and selected based on desired electrical characteristics, such as signaling speed, and/or mechanical characteristics, such as less susceptibility to thermal stress.

Before discussing examples of IC packages employing a thermal conductive semiconductor package substrate with die region split (e.g., a core die region split) starting at FIG. 3A, an IC package that does not employ a die region split is first discussed below with regard to FIGS. 2A and 2B.

Figure 2A:
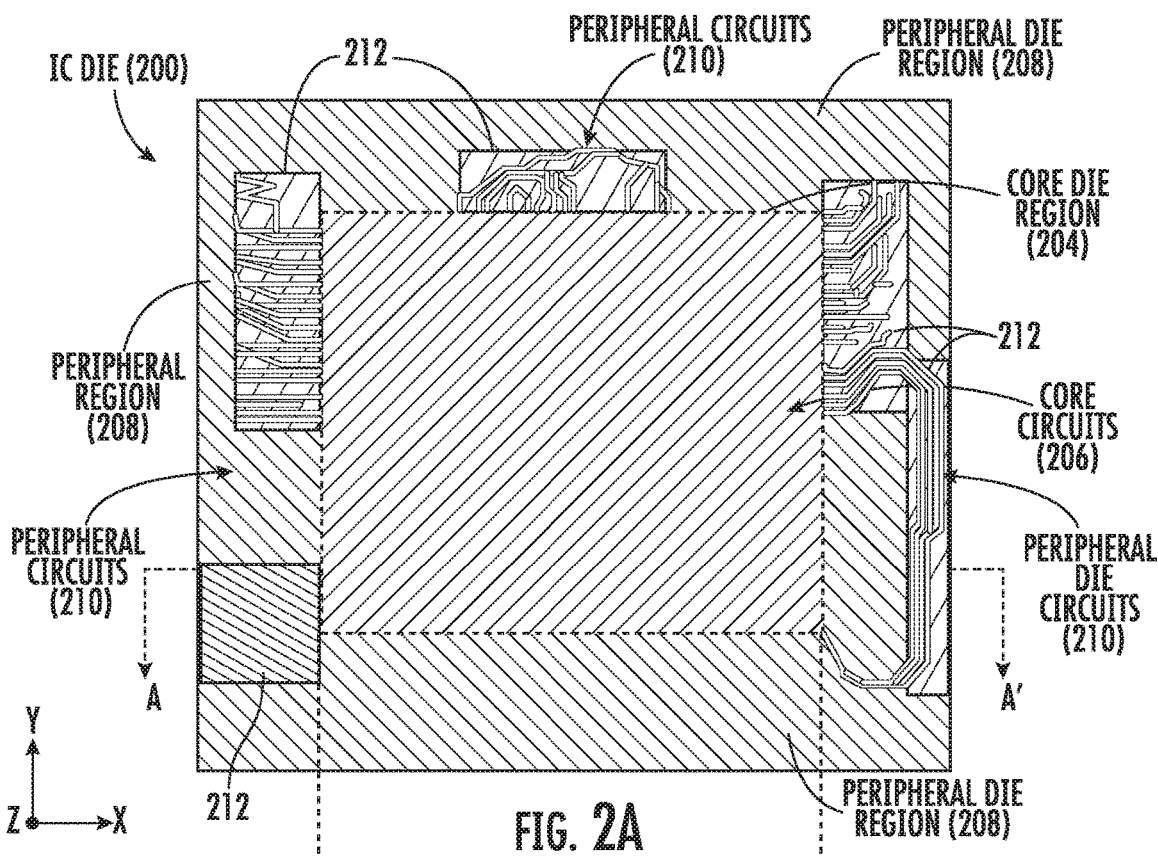
FIGS. 2A illustrates a top view of an exemplary die.
Figure 2B:
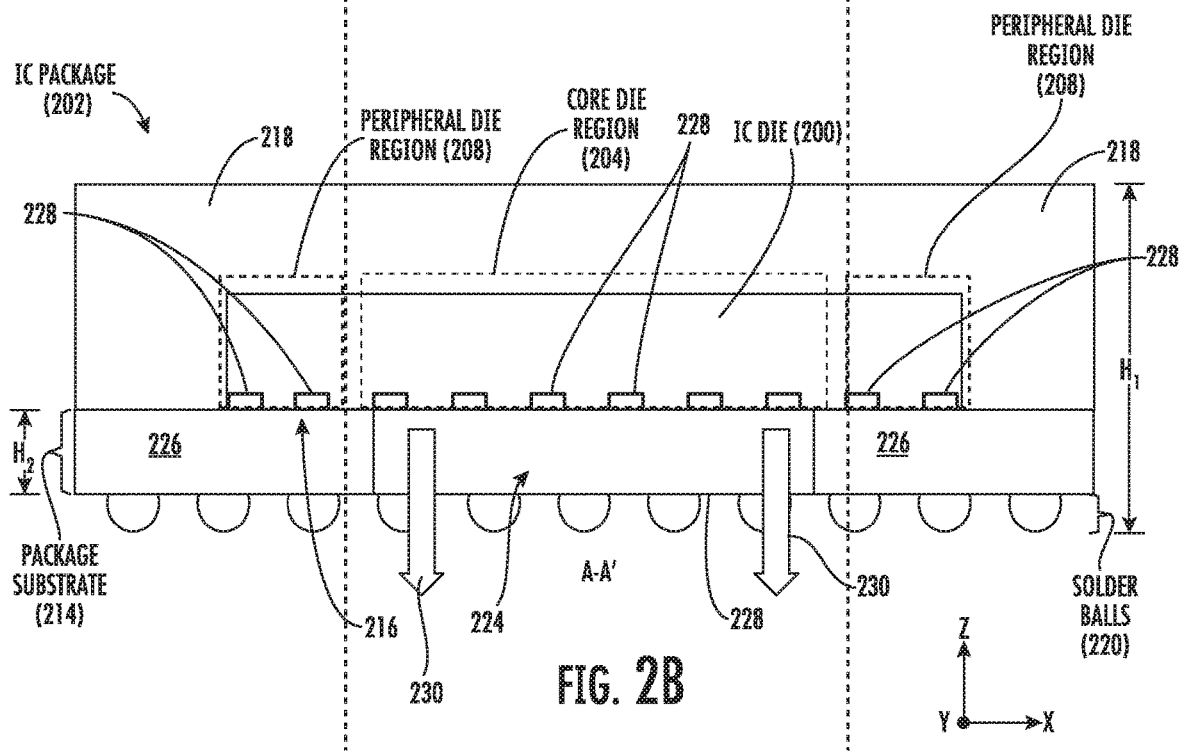
FIG. 2B illustrates a cross-sectional side view of an exemplary IC package that contains the IC die in FIG. 2A mounted on and electrically coupled to a package substrate that dissipates heat generated by the IC die.

FIG. 2A illustrates a top view (in an X-Y plane) of an exemplary IC die 200 that is included in an IC package 202 in FIG. 2B that does not employ a thermal conductive semiconductor package substrate with die region split. As shown in FIG. 2A, the IC die 200 is a semiconductor die that includes a core die region 204 that includes core ICs 206 ("core circuits 206") formed in the IC die 200. The core circuits 206 can include circuits that perform core operations of the IC die 200 such as a computer processing unit (CPU), graphics processor unit (GPU), memory, and/or a modem, as non-limiting examples. The IC die 200 also includes a peripheral die region 208 that outside of the core die region 204 as shown in FIG. 2A. The peripheral die region 208 of the IC die 200 that includes peripheral circuits 210 (e.g., input/output (I/O) circuits) that include electrical routing traces 212 ("electrical traces 212") to provide interfaces to the core circuits 206. The core circuits 206 and the peripheral circuits 210 generate heat when power is applied to the IC die 200 and the core circuits 206 and the peripheral circuits 210 are operational. Heat generated by the core circuits 206 and the peripheral circuits 210 dissipates through the IC package 202 shown in FIG. 2B. Thermal dissipation of heat generated by the IC die 200 is important, because temperature may limit the operational frequency of the IC die 200. Largely varying changes in temperature around the IC die 200 also cause the IC die 102 to expand and contract, which can introduce thermal stresses in the IC die 102. and reduce the life span of the IC die 200 as a result.

The IC package 202 can provide thermal dissipation of heat generated by the IC die 102 through a package substrate 214 of the IC die 200. FIG. 2B illustrates a side view of the IC die 200 in the IC package 202 along an A-A' cross-section line in FIG. 2A. For example, the IC package 202 in FIG. 2B is a flip-chip IC package that does not include a heat spreader. The IC die 200 has a front surface 216 (i.e., active surface) that is coupled to the package substrate 214 via a die attach and/or underfill adhesive. An epoxy and/or resin molding compound 218 may also be used to stabilize and protect the IC die 200. Solder balls 220 are formed on the bottom surface 222 of the package substrate 214 to provide an electrical interface to the IC die 200 when the IC package 202 is mounted to a printed circuit board (PCB). The package substrate 214 can be an embedded trace substrate (ETS) that includes one or more dielectric layers 226 that include embedded electrical traces 224 (e.g., copper metal traces) to provide electrical signal routing between the solder balls 220 and die interconnects 228. Metal contacts (e.g., copper contacts) are formed in the package substrate 214 in contact with the electrical traces 224 to provide a contact pad for coupling to the die interconnects 228, the solder balls 220 and/or vertical interconnects providing interconnections between different dielectric layers 226 in the package substrate 214. Thus, heat generated by the IC die 200 more readily dissipates as shown by arrows 230 through the conductive paths from the die interconnects 228 and the electrical traces 224 to the solder balls 220 than through the molding compound 218, for example.

Advances in the electrical performance of silicon integrated circuits (ICs) may result in a desire to shrink the IC die 200 in FIGS. 2A and 2B in the height direction, shown as the Z-axis direction. However, as the area of the IC die 200 grows smaller, the power consumption, and thus the power density across the IC die 200, increases. Increased power density across the IC die 200 directly translates to an increase in the amount of heat produced by the IC die 200. Moreover, it may be desired or necessary to also reduce a height $H_1$ of the IC package 202 in FIG. 2B in the height direction shown as the Z-axis direction. One way to reduce the height $H_1$ of the IC package 202 in FIG. 2B is to reduce the height $H_2$ of the package substrate 214. This can have the effect of reducing the height or thickness of the dielectric layer(s) 226 and metal contacts connected to the electrical traces 224 in the package substrate 214. Reducing the height or thickness of electrical traces 224 and/or metal contacts connected to the electrical traces 224 reduces the volume of metal material in the dielectric layer(s) 226, thus resulting in lower thermal dissipation of heat generated by the IC die 200. Reducing the thickness of the electrical traces 224 and/or metal contacts connected to the electrical traces in the package substrate 214 that results in a lesser volume of metal in the dielectric layer(s) 226 can reduce cross-talk between high speed signals carried on the electrical traces 224 from the peripheral circuits 210 in the IC die 200, for example, and thus provide a cross-talk shield technique. However, this comes at a penalty of lower heat dissipation that may not be desired or viable for the IC die 200 and IC package 202.

Figure 3A:
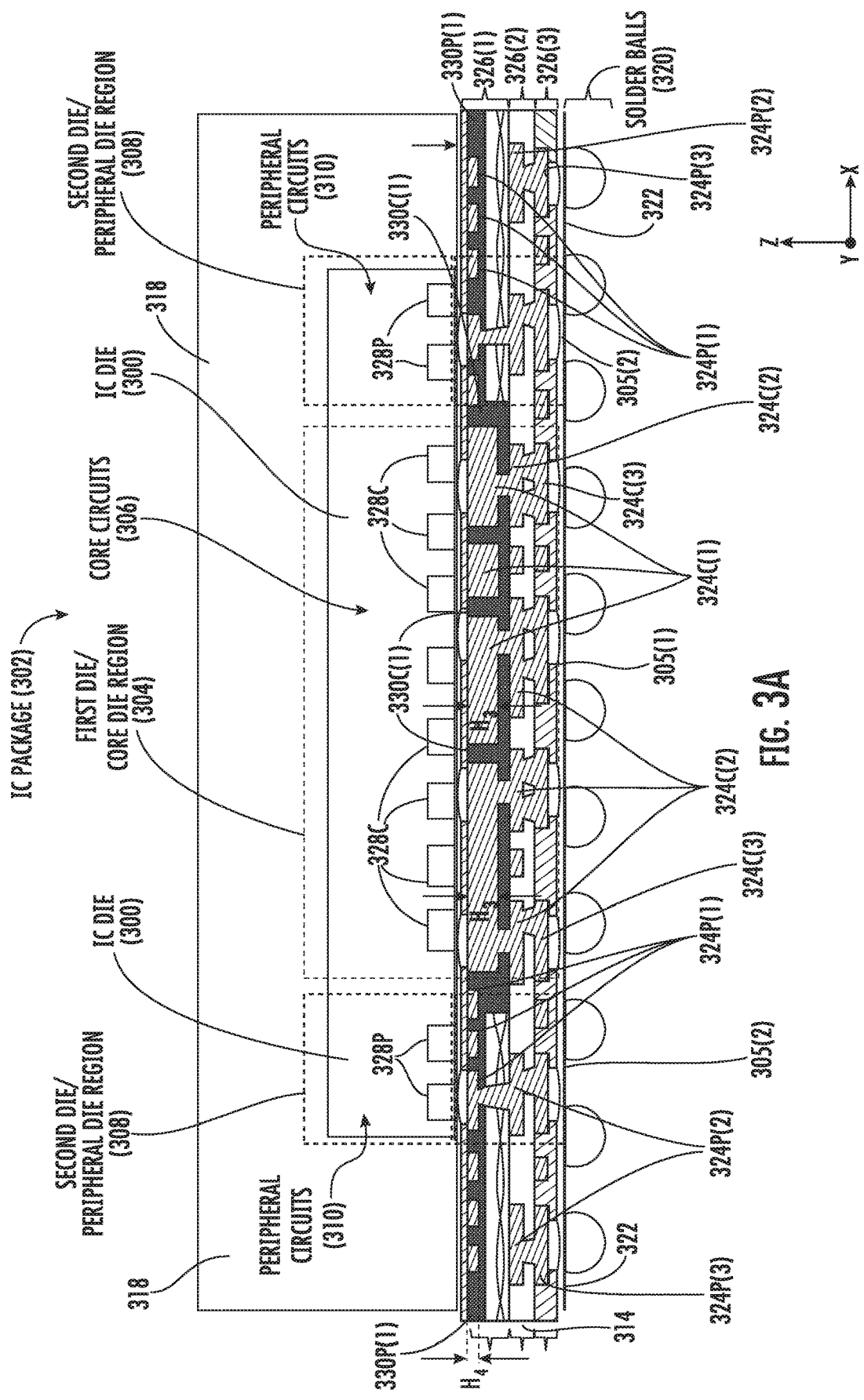
FIG. 3A illustrates a side view of an exemplary IC package that includes a package substrate that facilitates thermal dissipation from the IC die by including a dielectric layer that contains a die region split having one or more metal contacts of electrical traces underneath a core die region of the IC die(s) thicker in a height direction than metal contacts of electrical traces in the dielectric layer underneath the peripheral die region of the IC die(s), and wherein the core die region of the dielectric layer also includes a dielectric material having a higher thermal conductivity than a dielectric material in the peripheral die region.
Figure 3B:
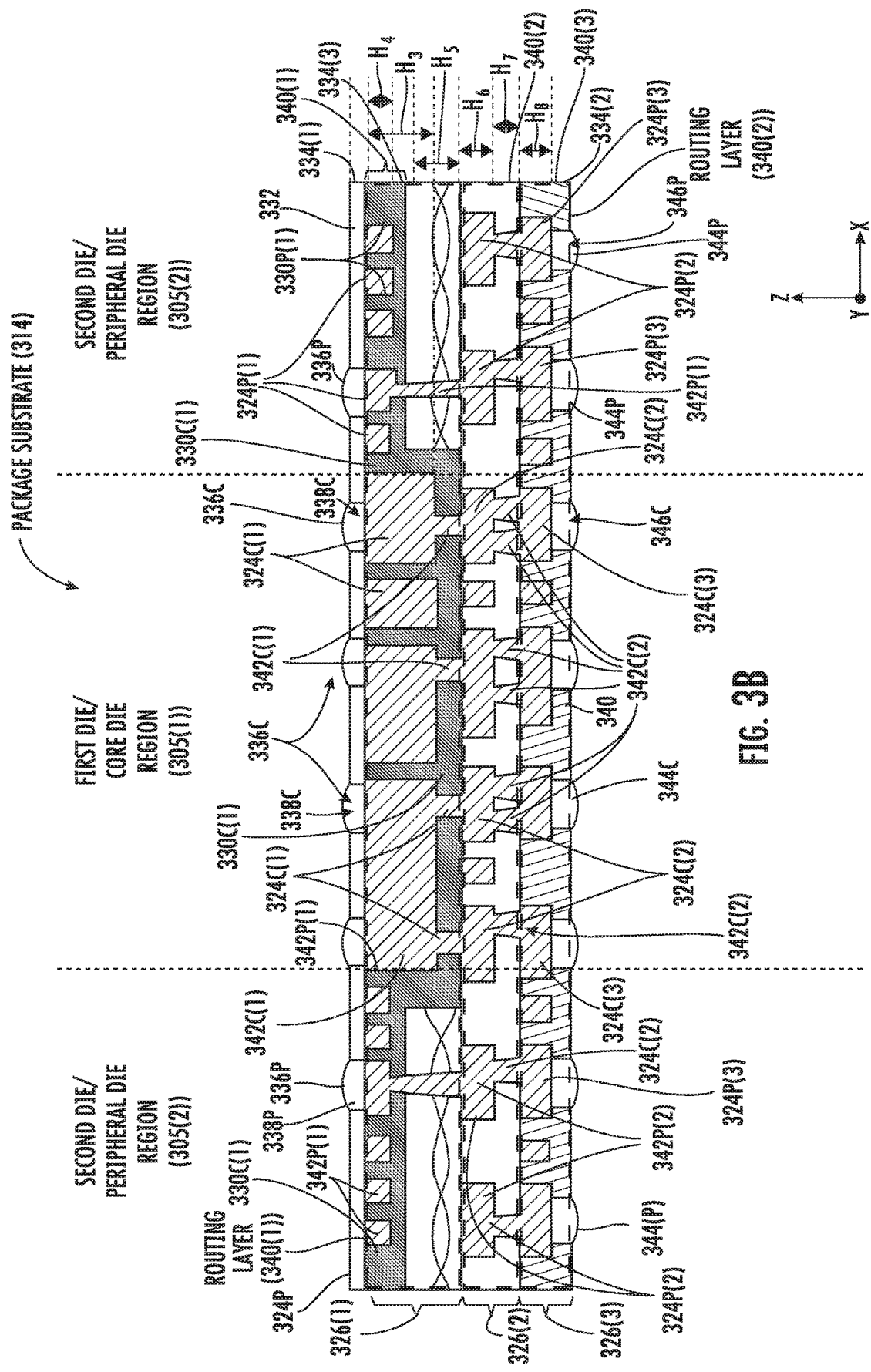
FIG. 3B is a more detailed side view of the package substrate in the IC package in FIG. 3A.

FIG. 3A illustrates a side view of an exemplary IC package 302 that includes an IC die 300 and a package substrate 314 that facilitates higher thermal dissipation from the IC die 300. FIG. 3B illustrates a more detailed side view of the package substrate 314 in the IC package 302 in FIG. 3A that is discussed in conjunction with FIG. 3A. As discussed in more detail below, the package substrate 314 in FIGS. 3A and 3B includes a first dielectric layer 326(1) that contains a die region split having one or more first metal contacts 324C(1) of electrical traces underneath a first die region 304 of the IC die 300. The first metal contacts 324C(1) to electrical traces underneath the first die region 304 of the IC die 300 and in a first die region 305(1) of the dielectric layer 326(1) have a height $H_3$ (shown in the Z-axis direction) taller than a height $H_4$ of second metal contacts 324P(1) to electrical traces in the dielectric layer 326(1) underneath a second die region 308 of the IC die 300 in a second die region 305(2) of the dielectric layer 326(1). Thus, the first and second metal contacts 324C(1), 324P(1) in the dielectric layer 326(1) are non-uniform in height in this example, such that their respective volumes are non-uniform. In this manner, a volume of the first metal contacts 324C(1) in the first die region 305(1) of the dielectric layer 326(1) is greater than a volume of the second metal contacts 324P(1) in the second die region 305(2) of the dielectric layer 326(1) to facilitate a higher thermal dissipation from the first die region 304 of the IC die 300 through first die region 305(1) of the package substrate 314.

As an example, the height $H_4$ of the second metal contacts 324P(1) in the second die region 305(2) of the dielectric layer 326(1) of the package substrate 314 may be selected to reduce cross-talk between high speed signals from the IC die 300 carried on the electrical traces in the second die region 305(2) of the dielectric layer 326(1) as a cross-talk shield technique. For example, height ft of the second metal contacts 324P(1) in the second die region 305(2) may be ten (10) micrometers (μm), whereas the height $H_3$, of the first metal contacts 324C(1) in the first die region 305(1) may be 1.5 to 3.0 times height $H_4$ which would be 15-30 μm in this example. However, a reduced height $H_4$ of the second metal contacts 324P(1) in the second die region 305(2) may come at a penalty of lower heat dissipation through the second die region 305(2) of the dielectric layer 326(1), but this may be of no detriment or consequence if the second die region 308 of the IC die 300 does not generate heat that cannot be dissipated sufficiently through the second die region 305(2) of the dielectric layer 326(1).

Also in the example of the IC package 302 in FIGS. 3A and 3B, the dielectric layer 326(1) can also include at least two different dielectric materials 330C(1), 330P(1) disposed adjacent to and/or surrounding the respective first and second metal contacts 324C(1), 324P(1), each having a different thermal conductivity. This facilitates further higher thermal dissipation from the first die region 304 of the IC die 300 through the first die region 305(1) of the dielectric layer 326(1) of the package substrate 314. The first dielectric material 330C(1) disposed in first die region 305(1) of the dielectric layer 326(1) is selected to have a higher thermal conductivity than the second dielectric material 330P(1) disposed in the second die region 305(2) of the dielectric layer 326(1). In this manner, the first dielectric material 330C(1) disposed in first die region 305(1) of the dielectric layer 326(1) facilitates higher heat dissipation for when, for example, the IC die 300 generates more heat in its first die region 304 above the first die region 305(1) of the dielectric layer 326(1). The second dielectric material 330P(1) disposed in second die region 305(2) of the dielectric layer 326(1) can be selected to provide the desired electrical and/or mechanical characteristics in the second die region 305(2) of the dielectric layer 326(1). For example, the second dielectric material 330P(1) having a lower thermal conductivity may provide more insulation to the electrical traces in the second die region 305(2) of the dielectric layer 326(1) to reduce cross-talk. The second dielectric material 330P(1) having a lower thermal conductivity may also be less brittle and thus make the dielectric layer 326(1) as a whole less susceptible to cracking that could otherwise cause short circuits in the electrical traces in the second die region 305(2) of the dielectric layer 326(1).

With reference to FIG. 3A, the IC package 302. includes the package substrate 314 that is disposed in a horizontal plane, which is an X-Y axis plane in the example. The package substrate 314 may be fabricated from a ceramic material in the laminated first and second dielectric layers 326(1), 326(2) as an example. The package substrate 314 includes a bottom surface 322 and a top surface 332 above the bottom surface 322 in the orientation shown in FIG. 3B. Note that "top" and "bottom" where used herein are relative terms and are not meant to limit or imply a strict orientation that a "top" referenced element must always be oriented to be above a "bottom" referenced element, and vice versa. The package substrate 314 includes a top interconnect layer 334(1) that includes first and second substrate interconnects 336C, 336P formed in patterns 338C, 338P exposed through the top surface 332 shown in FIG. 3B. The first and second substrate interconnects 336C, 336P in the top interconnect layer 334(1) allow electrical coupling of the package substrate 314 to respective first and second die interconnects 328C. 328P shown in FIG. 3A. Alternatively, the first and second substrate interconnects 336C, 336P could be the respective first and second metal contacts 324C(1), 324P(1). The top interconnect layer 334(1) could be a solder layer, wherein the first and second substrate interconnects 336C, 336P are solder bumps, as a non-limiting example.

The package substrate 314 includes the two dielectric layers 326(1), 326(2) in this example as shown in FIG. 3B. The dielectric layer 326(1) includes a routing layer 340(1) that includes the first and second metal contacts 324C(1), 324P(1) in the respective first and second die regions 305(1), 305(2) as discussed above, and that each are of respective heights $H_3$ and $H_4$ in the height direction (Z-axis) orthogonal to the plane of the package substrate 314. The first and second metal contacts 324C(1), 324P(1) are in contact with electrical traces that are routed in the routing layer 340(1). The first and second metal contacts 324C(1), 324P(1) are electrically coupled to the respective first and second die interconnects 328C, 328P to provide conductive paths from the first and second die interconnects 328C, 328P coupled to the IC die 300 in FIG. 3A through the package substrate 314.

With continuing reference to FIG. 3B, the package substrate 314 in this example also includes the second dielectric layer 326(2). The second dielectric layer 326(2) includes a second routing layer 340(2) that includes the third and fourth metal contacts 324C(2), 324P(2) also in the respective first and second die regions 305(1), 305(2), and that each are of a respective height $H_7$ in the height direction (Z-axis) orthogonal to the plane of the package substrate 314. The third and fourth metal contacts 324C(2), 324P(2) are in contact with electrical traces that are routed in the second routing layer 340(2). The third and fourth metal contacts 324C(2), 324P(2) are electrically coupled to the respective first and second metal contacts 324C(1), 324P(1) through vertical interconnects 342C(1), 342P(1), such as vertical interconnect accesses (vias) or conductive pillars, as examples, to provide conductive paths from the first and second die interconnects 328C, 328P coupled to the IC die 300 in FIG. 3A to the third and fourth metal contacts 324C(2), 324P(2). For example, the vertical interconnects 342C(1), 342P(1) are of height $H_5$ in this example, which may be 35-45 μm. The package substrate 314 in this example also includes a third dielectric layer 326(3) that includes a third routing layer 340(3) that includes the fifth and sixth metal contacts 324C(3), 324P(3) also in the respective first and second die regions 305(1), 305(2), and that each are of a respective height $Ill_s$ in the height direction (Z-axis) orthogonal to the plane of the package substrate 314. The fifth and sixth metal contacts 324C(3), 324P(3) are in contact with electrical traces that are routed in the dielectric layer 326(3). The fifth and sixth metal contacts 324C(3), 324P(3) are electrically coupled to the respective third and fourth metal contacts 324C(2), 324P(2) through vertical interconnects 342C(2), 342P(2) of height $H_7$ to provide conductive paths from the first and second die interconnects 328C, 328P coupled to the IC die 300 in FIG. 3A to the fifth and sixth metal contacts 324C(3), 324P(3) of height $H_8$. The package substrate 314 also includes a bottom interconnect layer 334(2) that includes third and fourth substrate interconnects 344C, 344P formed in patterns 346C, 346P exposed through the bottom surface 322 shown in FIG. 3B. The third and fourth substrate interconnects 344C, 344P in the bottom interconnect layer 334(2) allow electrical coupling of the package substrate 314 to contacts on a PCB to provide a conductive path between such PCB contacts and the die interconnects 328C, 328P of the IC die 300 shown in FIG. 3A. The bottom interconnect layer 334(2) could be a solder layer, wherein the third and fourth substrate interconnects 344C, 344P are solder bumps, as a non-limiting example.

As discussed above, the height $H_3$ of the first metal contacts 324C(1) in the first dielectric layer 326(1) are taller than the height $H_1$ of the second metal contacts 324P(1) to provide greater heat dissipation from heat generated by the IC die 300 in the first die region 304 through the first die region 305(1) of the first dielectric layer 326(1). For example, the height $H_3$ of the first metal contacts 324C(1) may be between 15 and 30 μm as an example, and the height $H_4$ of the second metal contacts 324P(1) may be between 5 and 10 µm as an example. The ratio of the height $H_3$ of the first metal contacts 324C(1) to the height $H_4$ of the second metal contacts 324P(1) may be at least 1.5 µm, and may be between 1.5 and 3.0 µm, as non-limiting examples. In this example, the height H, of the third and fourth metal contacts 324C(2), 324P(2) in the first and second die regions 305(1), 305(2) in the second dielectric layer 326(2) may be the same height $H_4$ as the second metal contacts 324P(1) in the second die region 305(2) of the first dielectric layer 326(1). However, although not shown in the example in FIGS. 3A and 3B, the third metal contacts 324C(2) in the second dielectric layer 326(2) could also be fabricated to be taller in height like the first metal contacts 324C(1) to increase heat dissipation through the second dielectric layer 326(2) as well. Similarly in this example, the height $H_8$ of the fifth and sixth metal contacts 324C(3), 324P(3) in the first and second die regions 305(1), 305(2) in the third dielectric layer 326(3) are may be the same height $H_4$ as the second metal contacts 324P(1) in the second die region 305(2) of the first dielectric layer 326(1). However, although not shown in the example in FIGS. 3A and 3B, the fifth metal contacts 324C(3) in the third dielectric layer 326(3) could also be fabricated to be taller in height like the first metal contacts 324C(1) to increase heat dissipation through the second dielectric layer 326(2) as well.

To further promote thermal dissipation through the first die region 305(1) of the dielectric layer 326(1) of the package substrate 314, the thermal conductivity of the first dielectric material 330C(1) may be at least 0.6 Watts per meter (m) Kelvin (K) (W/mK) and between 0.6 to 0.9 W/mK, as an example. The thermal conductivity of the second dielectric material 330P(1) may be 0.3 to 0.5 W/mK, as an example, The thermal conductivity of the first dielectric material 330C(1) may be at least 0.1 W/mK greater than the thermal conductivity of the second dielectric material 330P(1), as an example. A ratio of the thermal conductivity of the first dielectric material 330C(1) to the thermal conductivity of the second dielectric material 330P(1) may be at least 1.2, as an example. The dielectric constant of the first dielectric material 330C(1), which is related to its permittivity, may be between 3.7 and 3.9, and the dielectric constant of the second dielectric material 330P(1) may be between 3,7 and 3.9, as examples. If the second dielectric material 330P(1) is selected to provide additional electrical and/or mechanical benefit, the dielectric constant of the second dielectric material 330P(1) may be between 3.3 and 4.2, as an example. The second dielectric layer 326(2) may be comprised of a single type of dielectric material that has one of a given uniform thermal conductivity. In the example of FIG. 3A, the first die region 304 of the IC die 300 of the package substrate 314 may be considered a core die region 304 that contains core circuits 306 like the core circuits 206 in the IC die 200 described above in FIGS. 2A and 2B. The second die region 308 of the IC die 300 may be a peripheral die region 305(2) that contains peripheral circuits 310 like the peripheral circuits 210 in the IC die 200 described above in FIGS. 2A and 2B. In this manner, the first die region 305(1) of the dielectric layer 326(1) of the package substrate 314 is a core die region 304, and the second die region 305(2) of the dielectric layer 326(1) of the package substrate 314 is peripheral die region 305(2). Thus, the first metal contacts 324C(1) in the routing layer 340(1) of the dielectric layer 326(1) are substrate core metal contacts 324C(1) in the core die region 305(1) of the dielectric layer 326(1) of the package substrate 314. The second metal contacts 324P(1) in the routing layer 340(1) of the dielectric layer 326(1) are substrate peripheral metal contacts 324P(1) in the peripheral die region 305(2) of the dielectric layer 326(1) of the package substrate 314. The first and second metal contacts 324C(1), 324P(1) are configured to be electrically coupled to the first and second die interconnects 328C, 328P of the IC die 300 as core and peripheral die interconnects 328C, 328P. The first and second metal contacts 324C(1), 324P(1) are electrically coupled to core and peripheral die interconnects 328C, 328P through the first and second substrate interconnects 336C, 336P as substrate core and peripheral interconnects 336C, 336P.

In this manner, the volume of the substrate core metal contacts 324C(1) in the core die region 305(1) of the dielectric layer 326(1) is greater than the volume of the substrate peripheral metal contacts 324P(1) in the peripheral die region 305(2) of the dielectric layer 326(1) to facilitate a higher thermal dissipation from the core die region 304 of the IC die 300 through the core die region 305(1) of the package substrate 314. The substrate core metal contacts 324C(1) are disposed adjacent to the first dielectric material 330C(1), and the substrate peripheral metal contacts 324P(1) are disposed adjacent to the second dielectric material 330P(1) in one example. The first dielectric material 330C (1) may be adjacent to and surround the substrate core metal contacts 324C(1), and the second dielectric material 330P(1) may be adjacent to and surround the substrate peripheral metal contacts 324P(1) as another example. As discussed above, the first dielectric material 330C(1) having a higher thermal conductivity facilitates higher thermal dissipation from core die region 304 of the IC die 300 through the core die region 305(1) of the first dielectric layer 326(1) of the package substrate 314. The second dielectric material 330P (1) disposed in the peripheral die region 305(2) of the dielectric layer 326(1) can be selected to provide the desired electrical and/or mechanical characteristics in the peripheral die region 305(2) of the dielectric layer 326(1), as discussed above.

Likewise, the third metal contacts 324C(2) in the second dielectric layer 326(2) can be considered substrate core metal contacts 324C(2) in the core die region 305(1) of the dielectric layer 326(1) of the package substrate 314. The fourth metal contacts 324P(2) in the second dielectric layer 326(2) can be considered substrate peripheral metal contacts 324P(2) in the peripheral die region 305(2) of the first dielectric layer 326(1) of the package substrate 314. A third dielectric layer 326(3) is provided below the second dielectric layer 326(2) and contains fifth and sixth metal contacts 324C(3), 324P(3) to provide conductivity between the electrical traces in the second dielectric layer 326(2) and external interconnects 320 in the form of solder balls in this example.

Note that in this example, the first dialectic layer 326(1) includes the first routing layer 340(1). The second dielectric layer 326(2) includes the second routing layer 340(2). The third dielectric layer 326(3) includes the third routing layer 340(3). The first dielectric material 330C(1) in the first dielectric layer 326(1) is disposed. adjacent to and surrounds the substrate core metal contacts 324C(1) in the first routing layer 340(1) and thus, the first dielectric material 330C(1) can be thought of as also being included in the first routing layer 340(1). The second dielectric material 330P(1) in the first dielectric layer 326(1) is disposed adjacent to and surrounds the substrate core metal contacts 324C(1) in the first routing layer 340(1) and thus, the second dielectric material 330P(1) can be thought of as also being included in the first routing layer 340(1). Dielectric material in the second and third dielectric layers 326(2), 326(3) can also be thought of as being included in their respective second and third routing layers 340(2), 340(3).

Figure 4:
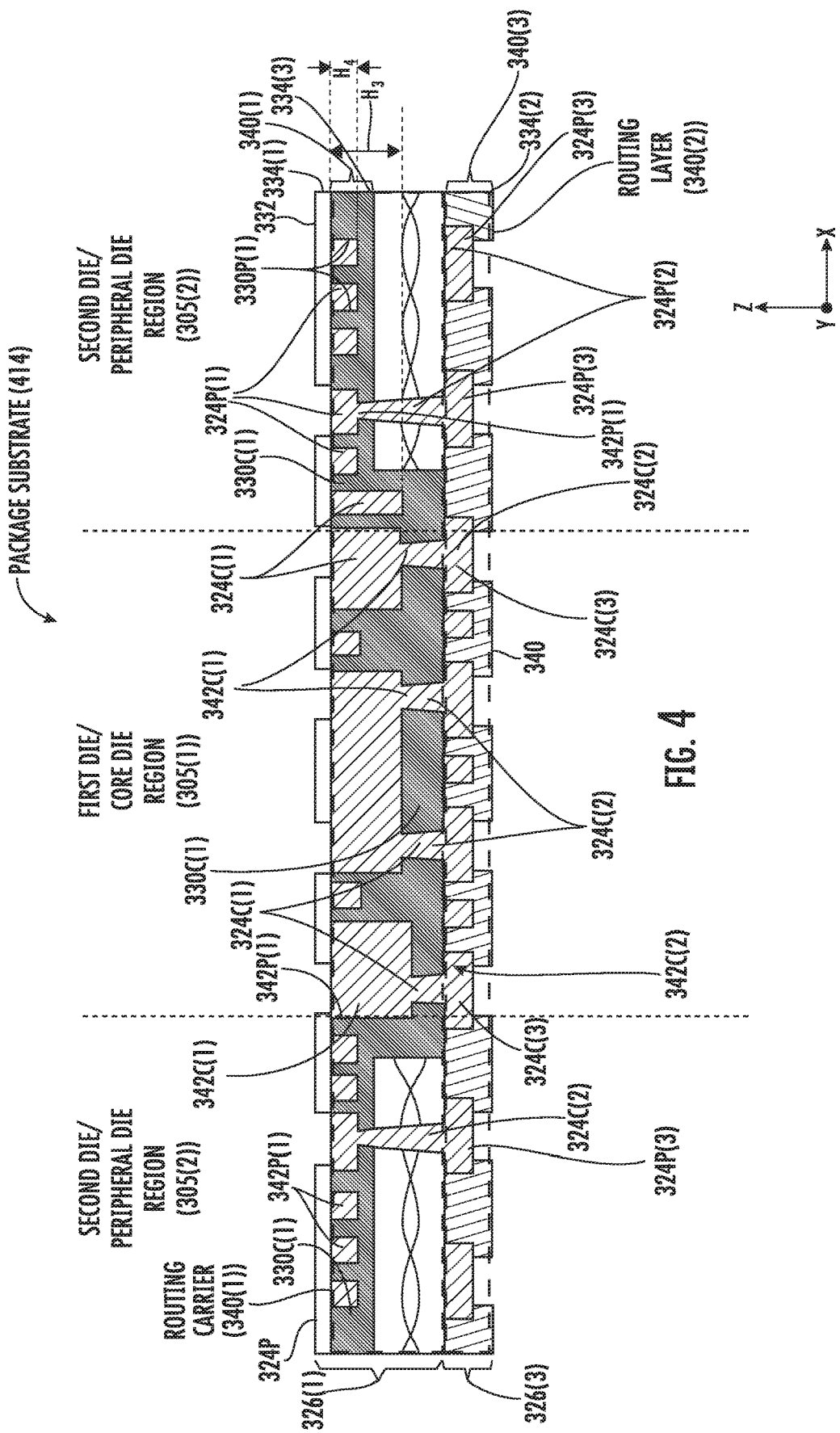
FIG. 4 is another exemplary two layer (2L) package substrate that facilitates thermal dissipation from the IC die by including a dielectric layer that contains a die region split having one or more metal contacts of electrical traces underneath a core die region of the IC die(s) thicker in a height direction than metal contacts of electrical traces in the dielectric layer underneath the peripheral die region of the IC die(s), and wherein the core die region of the dielectric layer also includes a dielectric material having a higher thermal conductivity than a dielectric material in the peripheral die region.

FIG. 4 illustrates another example of a package substrate 414 that only has two (2) of the dielectric layers in the package substrate 314 in FIGS. 3A and 3B. The package substrate 414 in FIG. 4 can be employed in an IC package, such as the IC package 302 in FIG. 3A. In FIG. 4, the package substrate 414 includes first and third dielectric layers 326(1), 326(3) and does not include the middle, second dielectric layer 326(2) in the package substrate 314. In this regard, the package substrate 414 in FIG. 4 does not include the third and fourth metal contacts 324C(2), 324P(2) and their associated electrical traces. The first and second metal contacts 324C(1), 324P(1) in the first dielectric layer 326(1) are directly coupled through the vertical interconnects 342C(1), 342P(1) to the fifth and sixth metal contacts 324C(3), 324P(3) in the third dielectric layer 326(3). Other common components between the package substrate 414 in FIG. 4 and the package substrate 314 in FIGS. 3A and 3B are shown with common element numbers and are not re-described.

Figure 5:
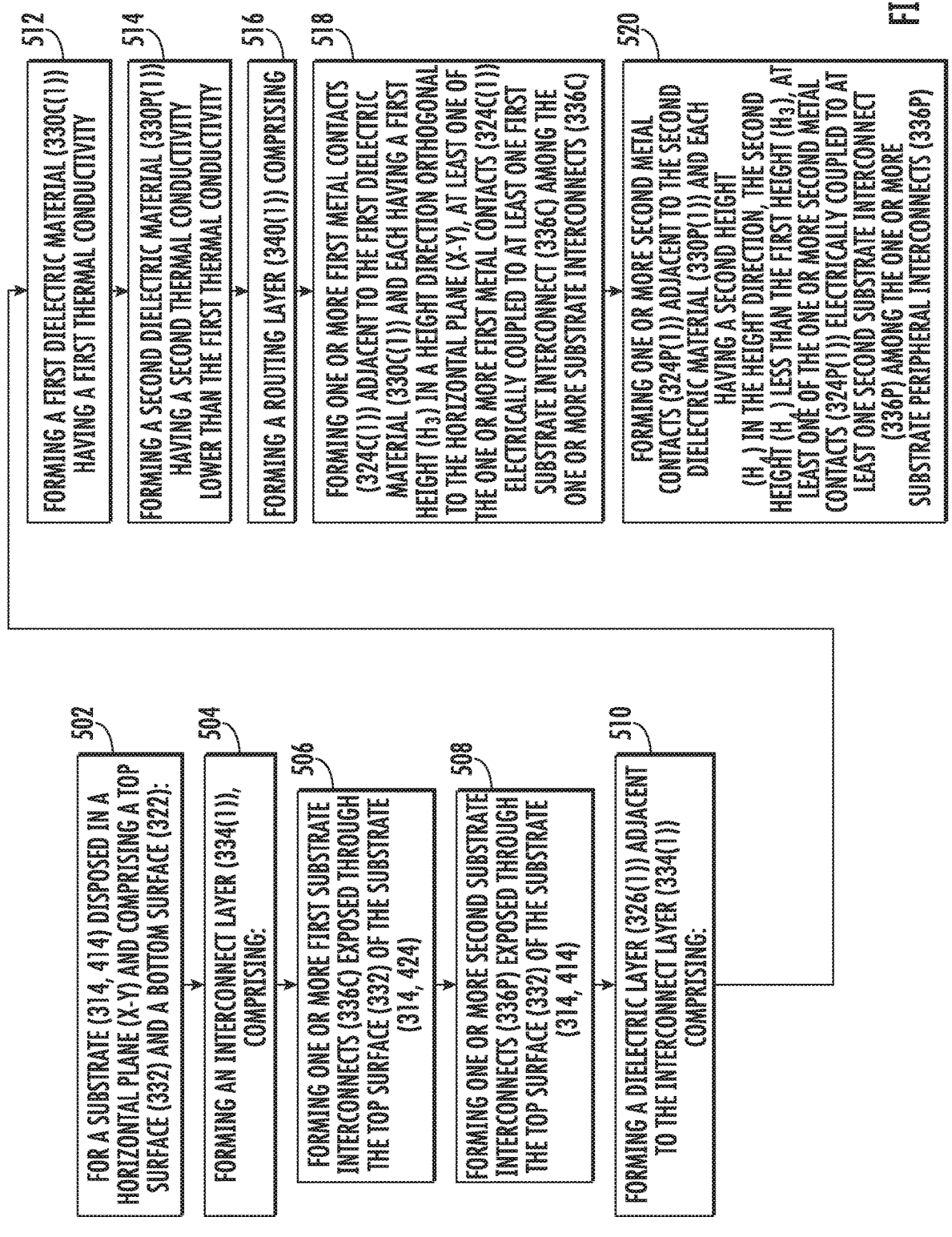
FIG. 5 is a flowchart illustrating an exemplary process of fabricating a package substrate that contains a die region split, including the package substrates in FIGS. 3A-3B and 4.

FIG. 5 is a flowchart illustrating an exemplary process of fabricating a package substrate that contains a die region split, including the package substrates 314 and 414 in FIGS. 3A-3B and 4. The package substrates 314, 414 in FIGS. 3A-3B and 4 are referenced in this exemplary process. The process includes forming a package substrate 314, 414 disposed in a horizontal plane (X-Y) (block 502 in FIG. 5), The package substrate 314, 414 comprises a top surface 332 and the bottom surface 322. The process also includes forming an interconnect layer 334(1) (block 504 in FIG. 5). The process of forming the top interconnect layer 334(1) includes forming one or more substrate interconnects 336C, 336P exposed through the top surface 332 of the substrate 314, 414 (blocks 506, 508 in FIG. 5). For example, the process of forming the top interconnect layer 334(1) includes forming one or more first substrate interconnects 336C exposed through the top surface 332 of the substrate 314, 414 (block 506 in FIG. 5), Also for example, the process of forming the top interconnect layer 334(1) also includes forming one or more second substrate interconnects 336P exposed through the top surface 332 of the substrate 314, 414 (block 508 in FIG. 5). The process also includes forming a first dielectric layer 326(1) (block 510 in FIG. 5).

The process of forming the dielectric layer 326(1) includes forming a first dielectric material 330C(1) having a first thermal conductivity (block 512 in FIG. 5). The process of forming the dielectric layer 326(1) includes forming a second dielectric material 330P(1) having a second thermal conductivity lower than the first thermal conductivity (block 514 in FIG. 5). The process of forming the dielectric layer 326(1) also includes forming the routing layer 340(1) (block 516 in FIG. 5). As an example, forming the routing layer 340(1) comprises forming the one or more first metal contacts 324C(1) disposed adjacent to the first dielectric material 330C(1), wherein the one or more first metal contacts 324C(1) each have the first height $H_3$ in a height direction orthogonal to the horizontal plane (X-Y), and wherein at least one of the one or more first metal contacts 324C(1) is electrically coupled to at least one first substrate interconnect 336C among the one or more first substrate interconnects 336C (block 518 in FIG. 5). The process of forming the dielectric layer 326(1) also includes forming the one or more second metal contacts 324P(1) disposed adjacent to the second dielectric material 330C(1), wherein the one or more second metal contacts 324P(1) each have a second height $H_4$ in the height direction, the second height $H_4$ less than the first height $H_3$, and wherein at least one of the one or more second metal contacts 324P(1) electrically coupled to at least one second substrate interconnect 336P among the one or more second substrate peripheral interconnects 336P (block 520 in FIG. 5).

Figure 6A:
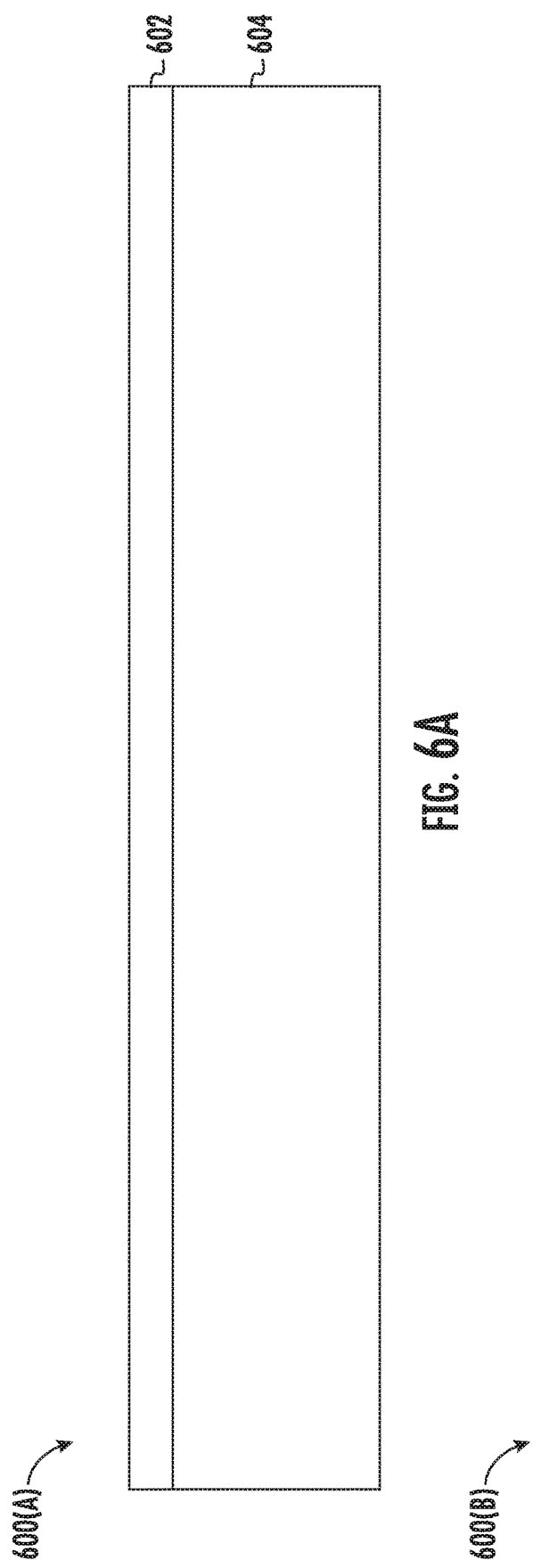
FIGS. 6A-6T illustrate exemplary fabrication stages of the fabrication of a package substrate that contains a die region split according to the exemplary process in FIG. 5.
Figure 6B:
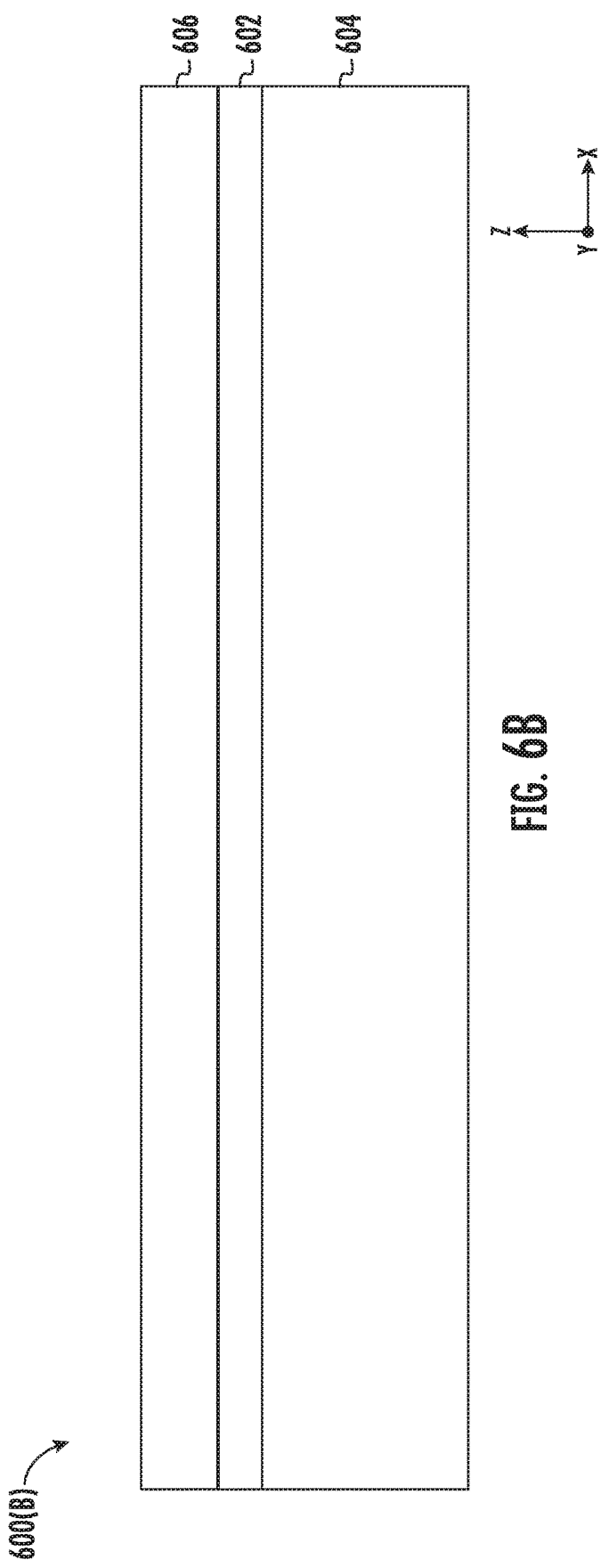
Figure 6C:
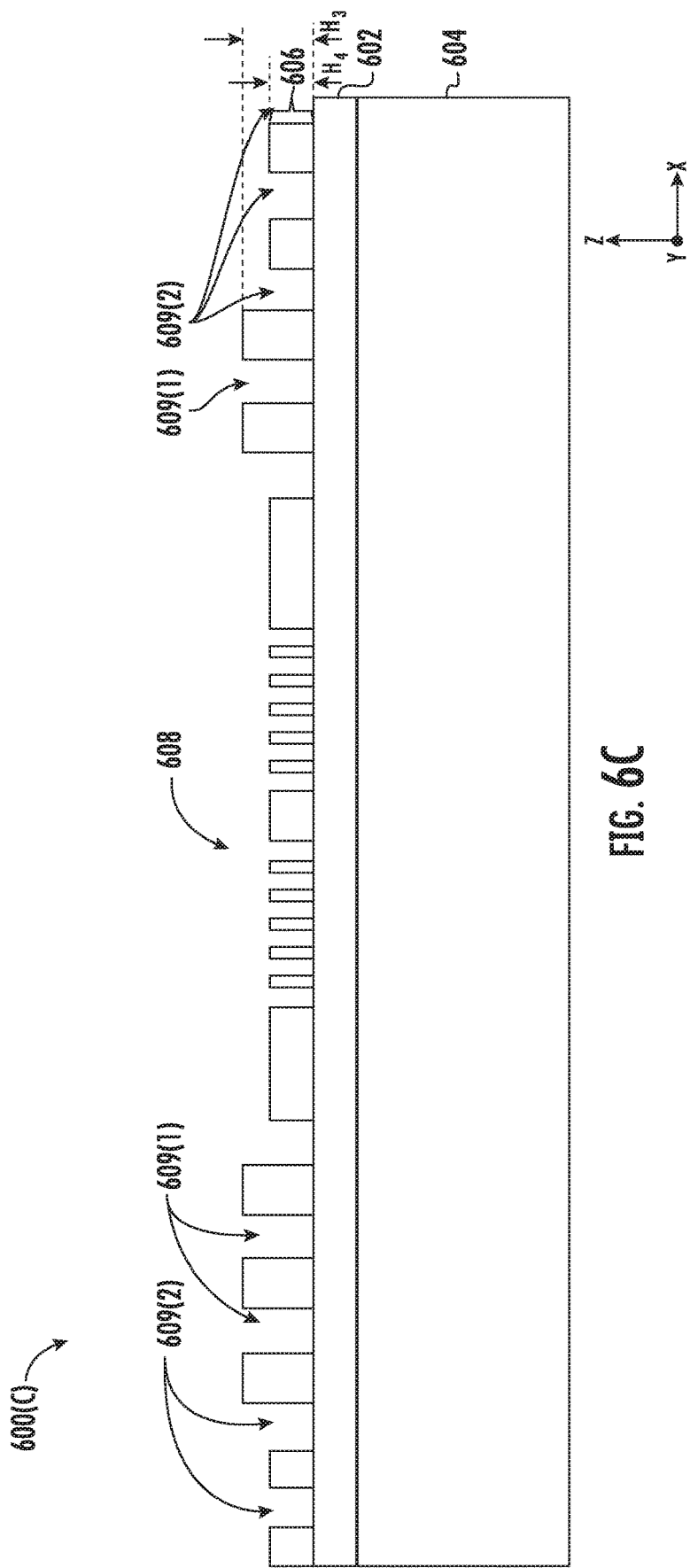
Figure 6D:
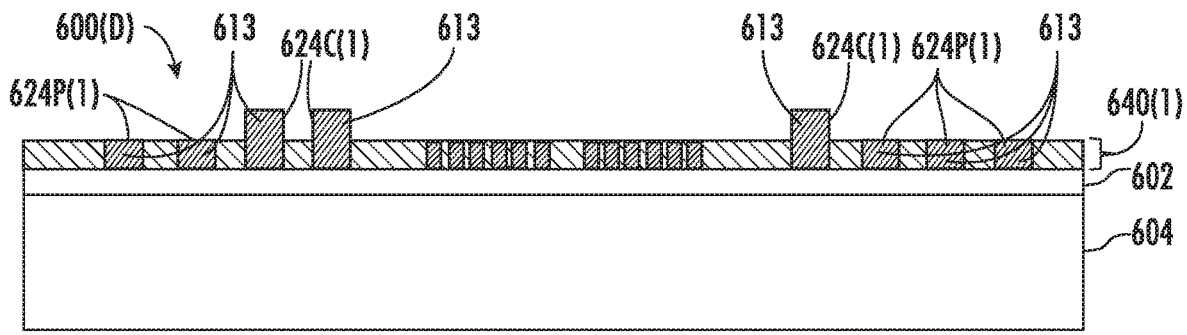
Figure 6E:
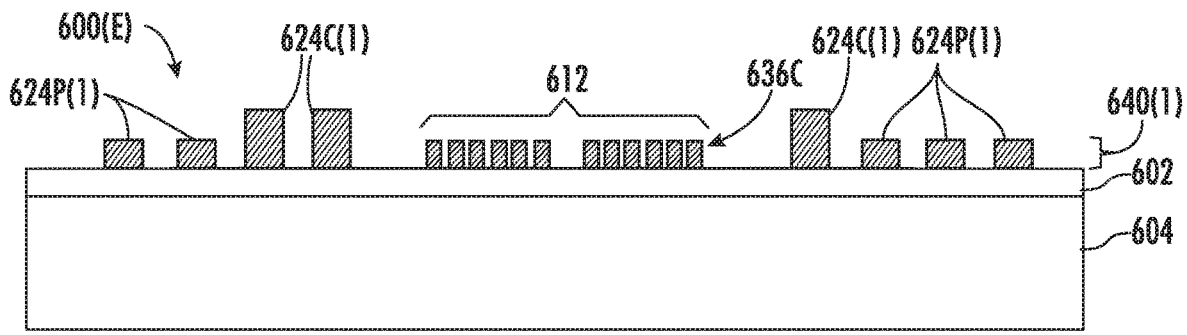
Figure 6F:
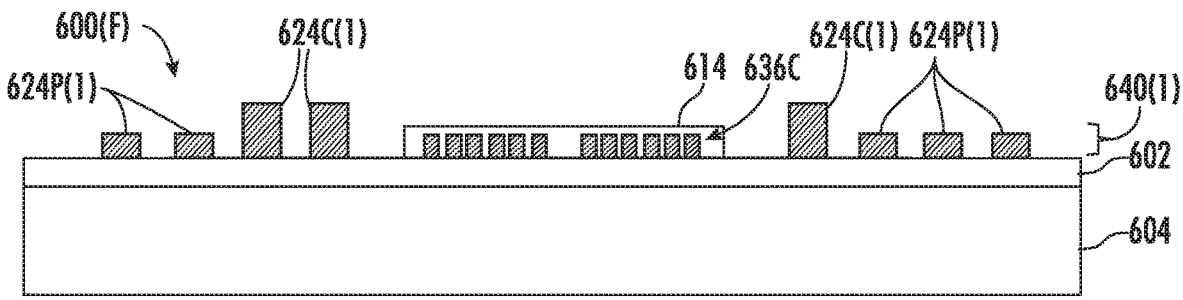
Figure 6G:
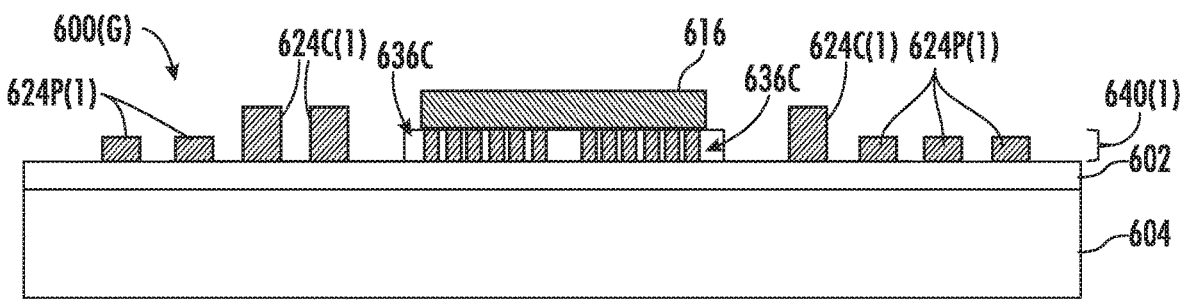
Figure 6H:
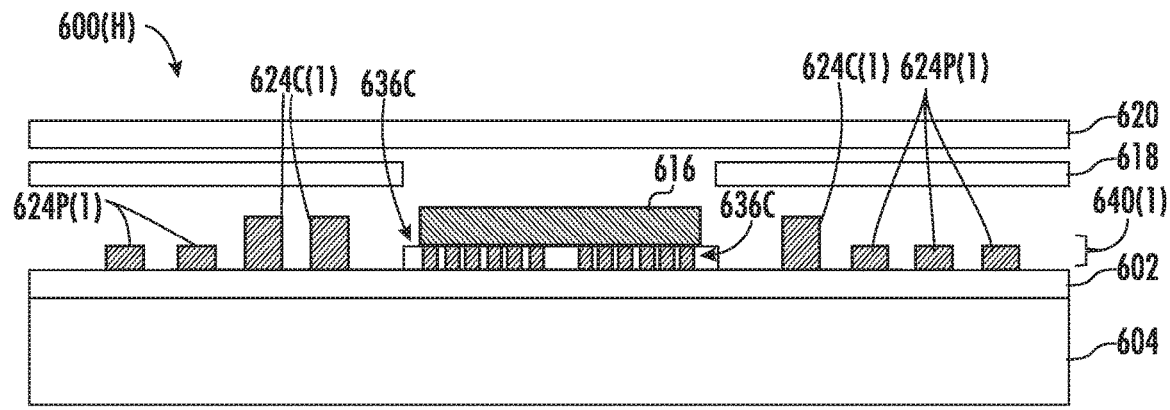
Figure 6I:
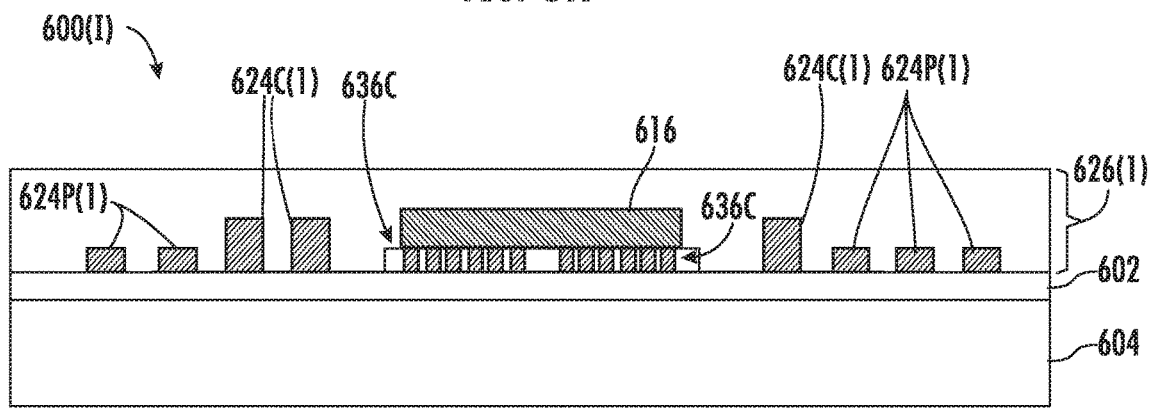
Figure 6J:
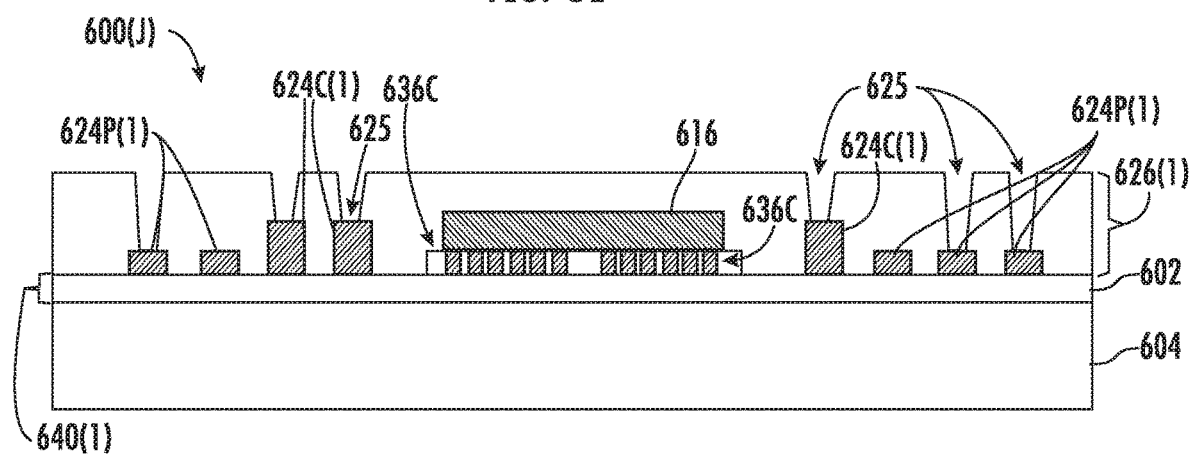
Figure 6K:
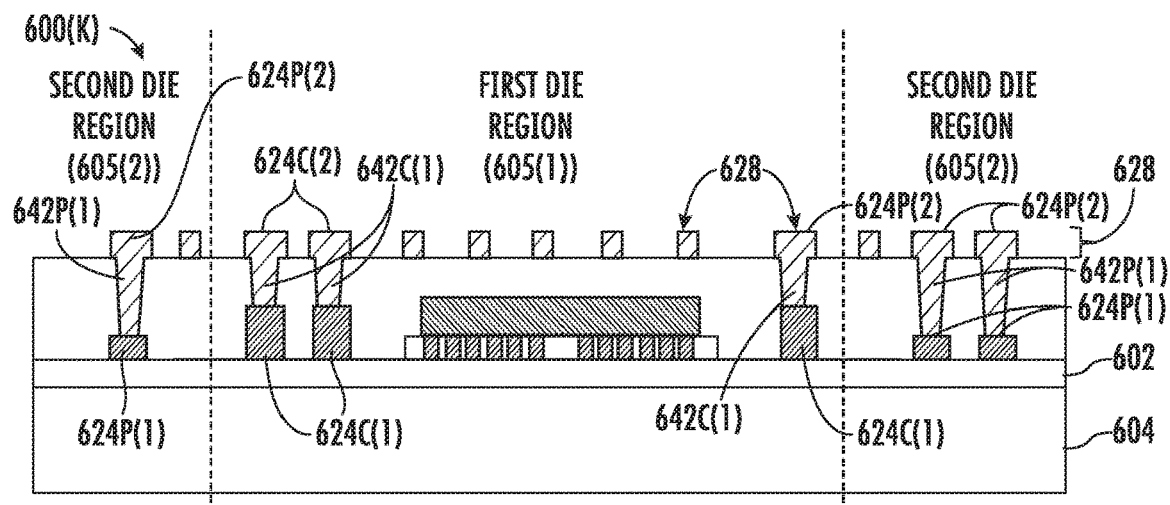
Figure 6L:
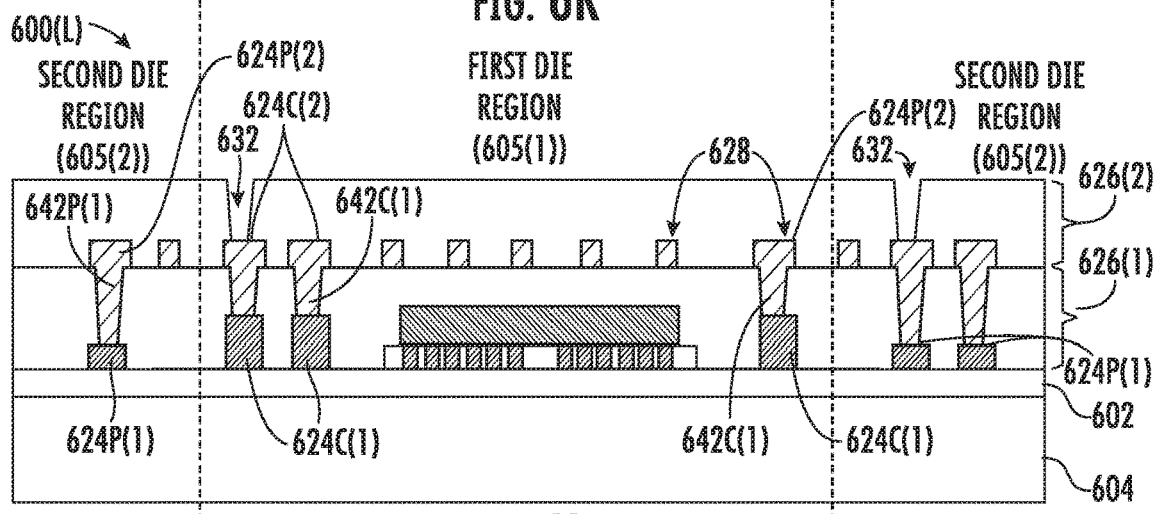
Figure 6M:
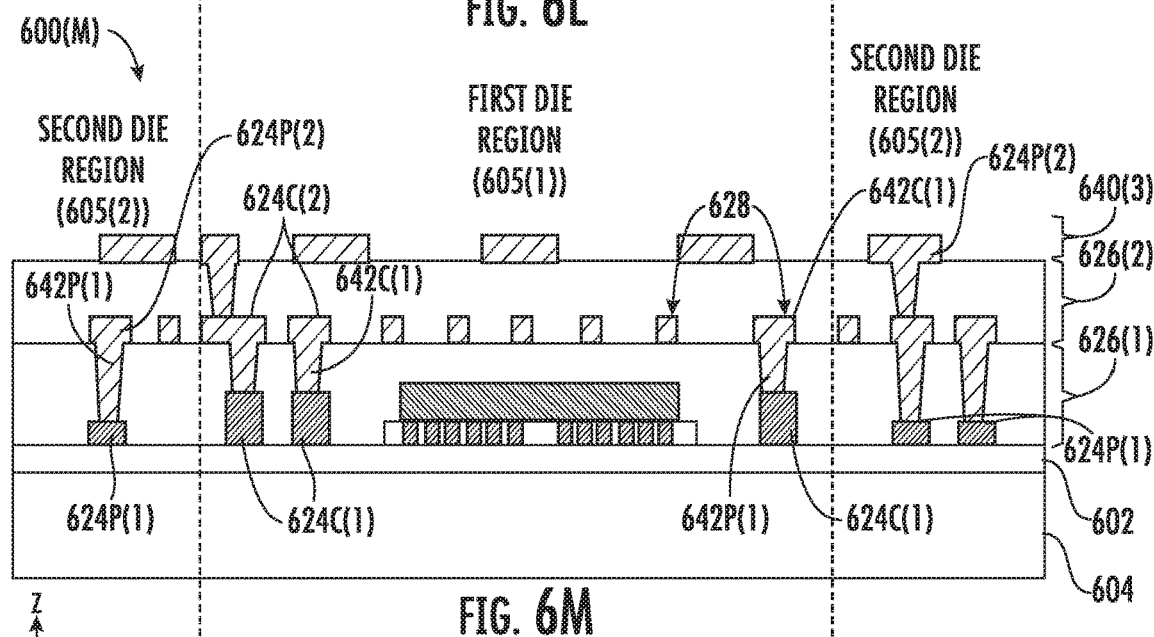
Figure 6N:
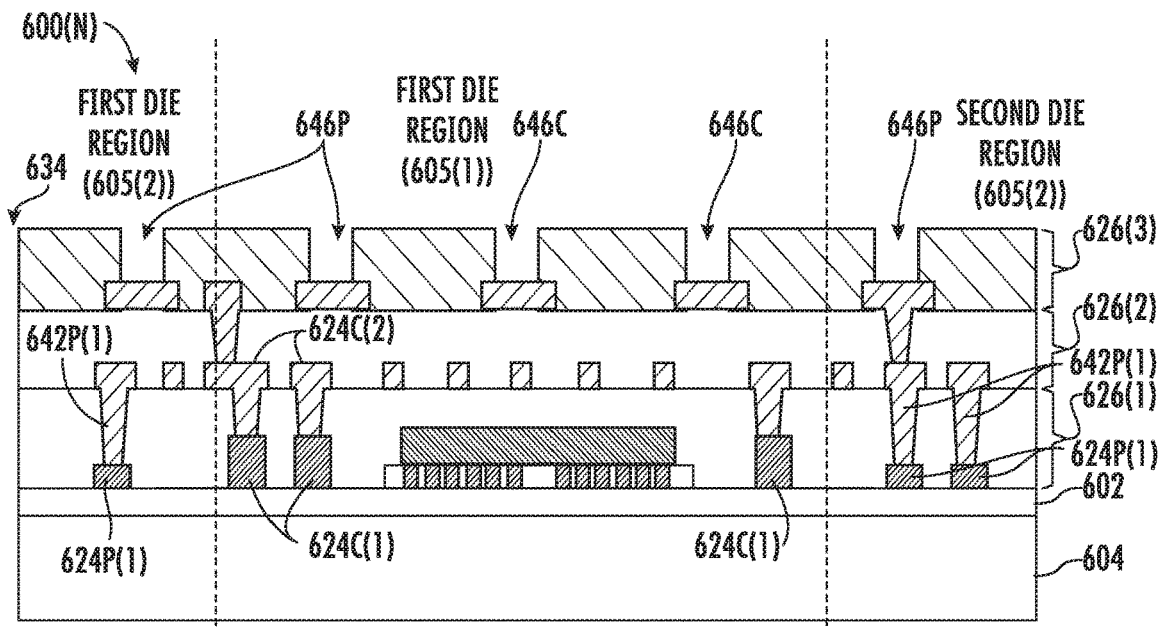
Figure 6O:
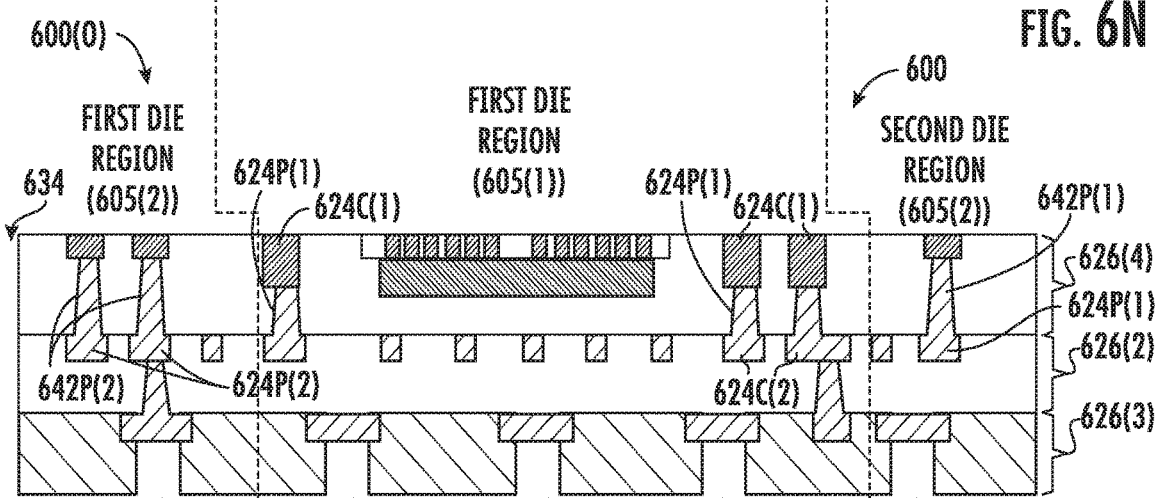
Figure 6P:
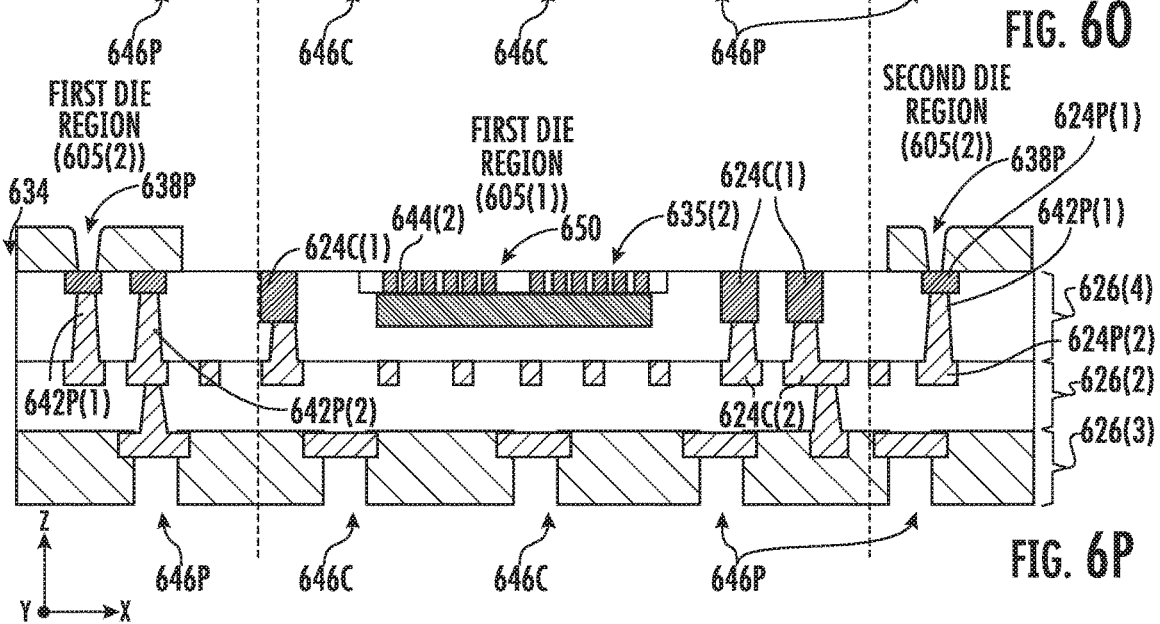
Figure 6Q:
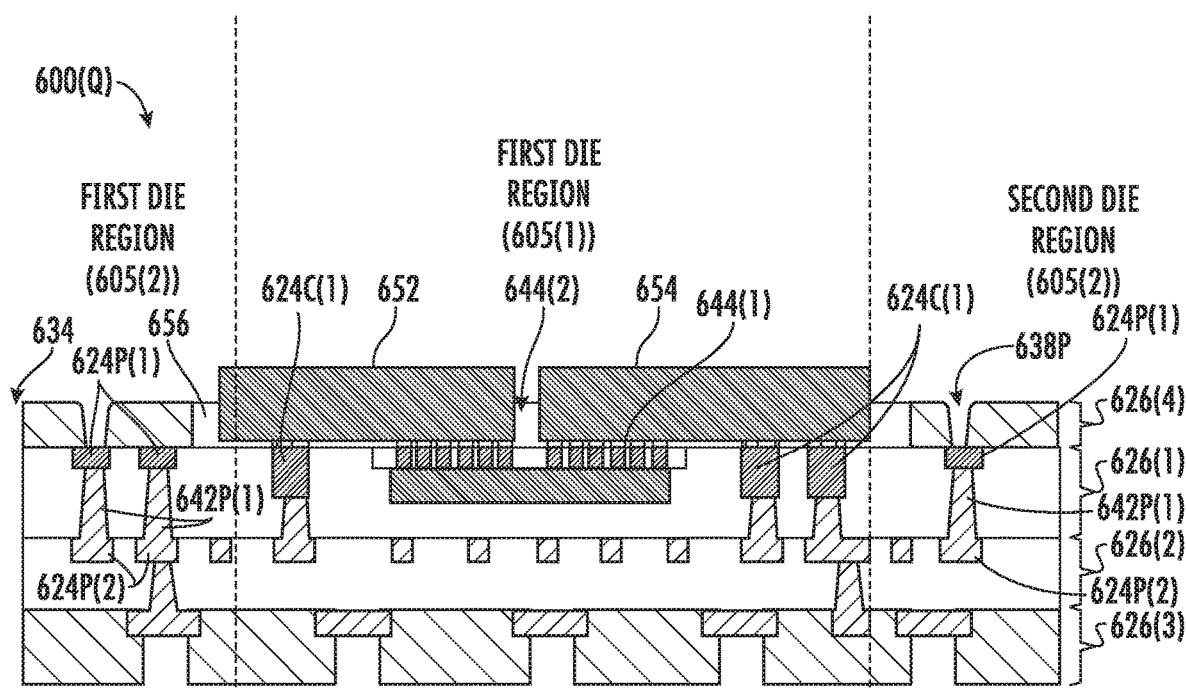
Figure 6R:
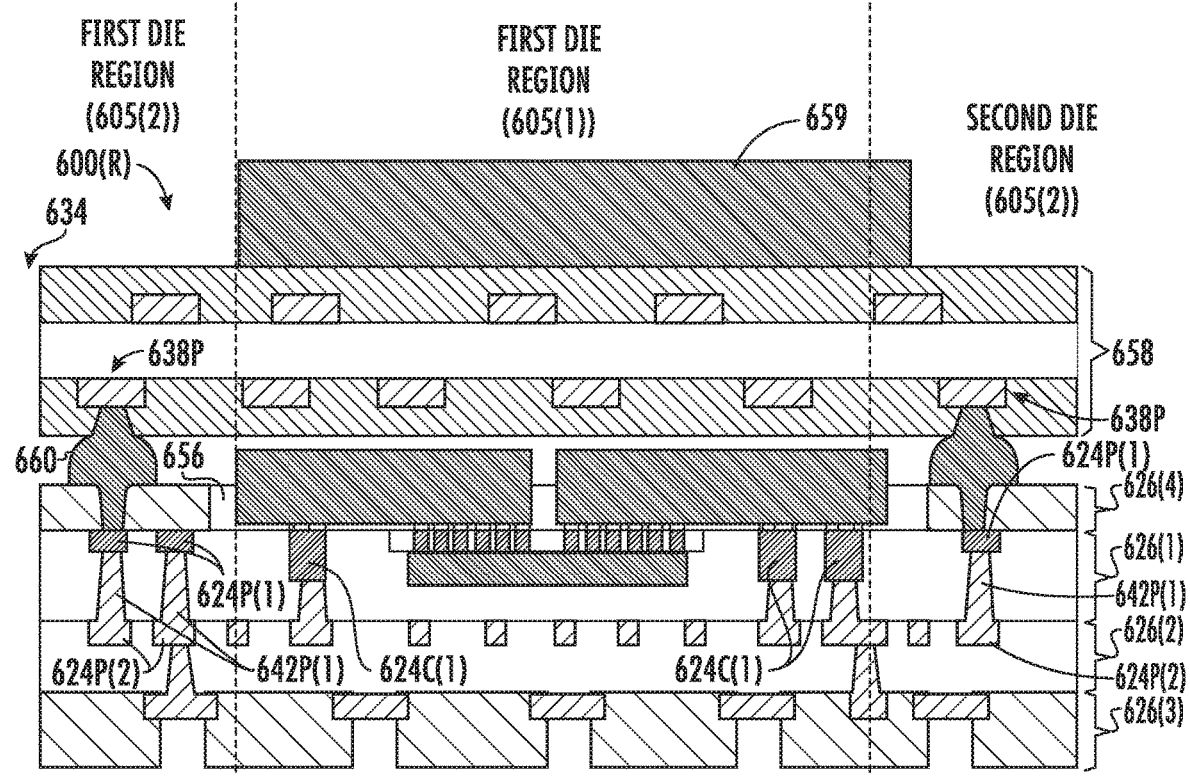
Figure 6S:
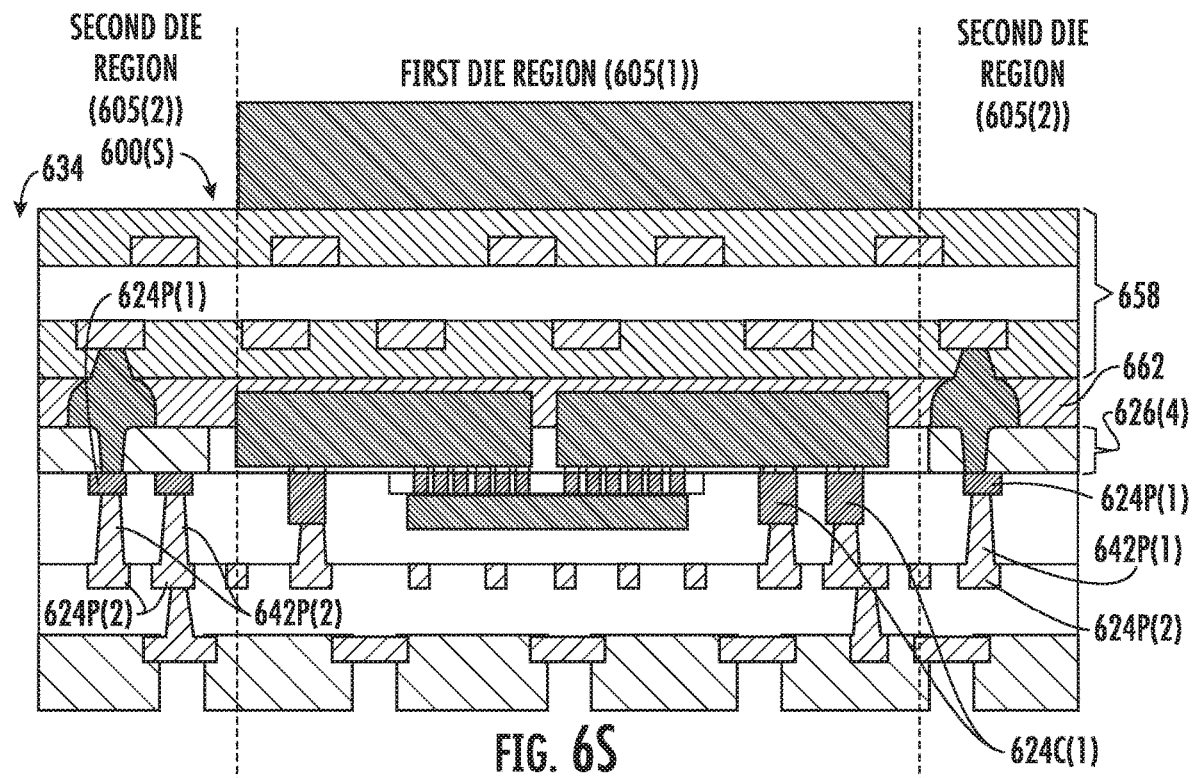
Figure 6T:
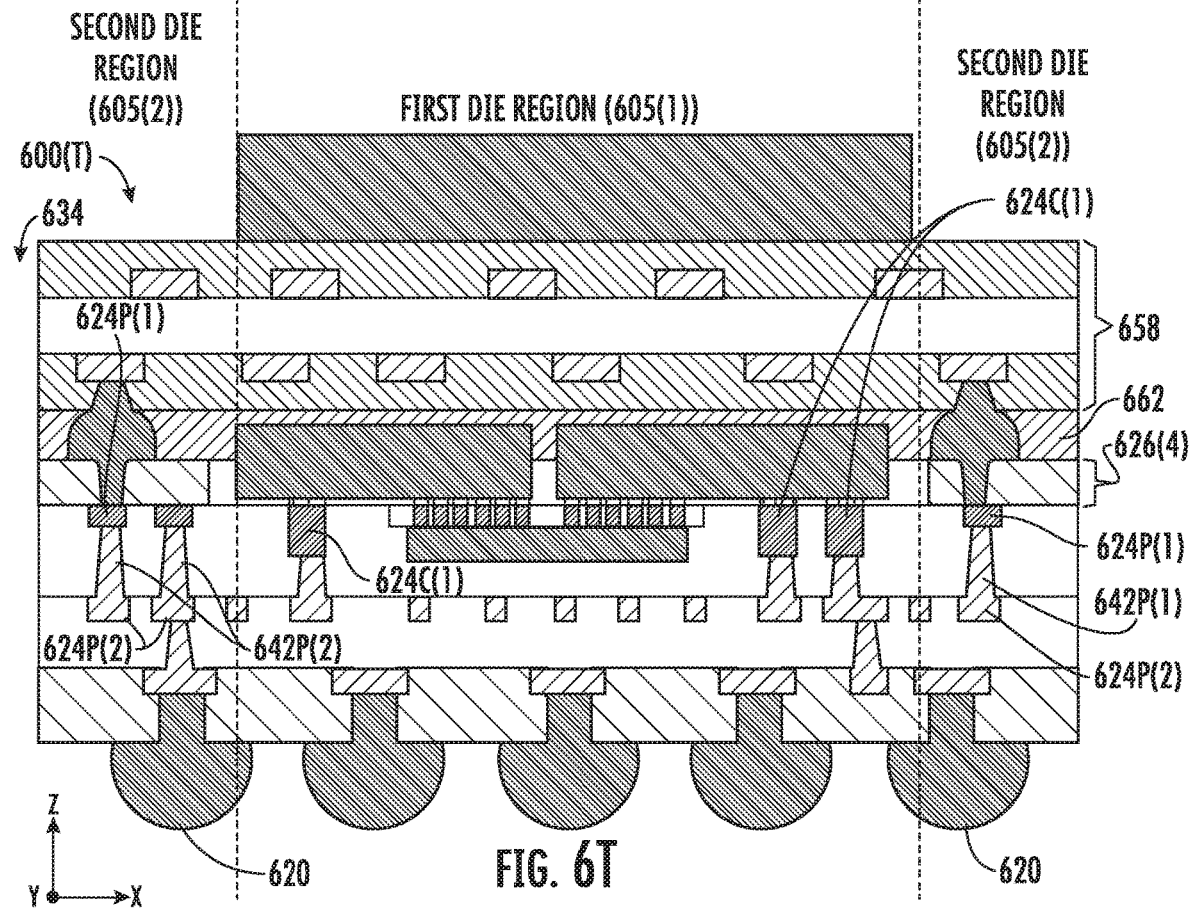

FIGS. 6A-6T illustrate exemplary fabrication stages of the fabrication of a package substrate that contains a die region split according to the exemplary process in FIG. 5, As shown in exemplary fabrication stage 600(A) in FIG. 6A, the exemplary partial process begins with applying a copper seed layer 602 to a carrier 604 (e.g., a copper carrier). As shown in exemplary fabrication stage 600(B) in FIG. 6B, the process continues with applying a photoresist layer 606 on the copper seed layer 602. As shown in exemplary fabrication stage 600(C) in FIG. 6C, a lithographic process is applied to form a routing layer pattern 608 in the photoresist layer 606. The routing layer pattern 608 includes first openings 609(1) of a first height to form metal contacts 624C(1) of the first height $H_3$ and second openings 609(2) at a second height to form metal contacts 624P(1) of the second height $H_4$. As shown in exemplary fabrication stage 600(D) in FIG. 6D, a copper plating process is applied to form a first routing layer 640(1) in the routing layer pattern 608 to form first and second metal contacts 624C(1), 624P(1). A metal material 613 (e.g., copper) is disposed in the first openings 609(1) and the second openings 609(2) to form the metal contacts 624C(1), 624P(1). Note that the first metal contacts 624C(1) are taller in height in the Z-axis or height direction than the second metal contacts 624P(1). As shown in exemplary fabrication stage 600(E) in FIG. 6E, the photoresist layer 606 is stripped away, exposing a routing layer 640(1) that includes a first contact layer 612 to provide the substrate interconnects 636C.

As shown in exemplary fabrication stage 600(F) in FIG. 6F, the process continues with the application of a non-conductive paste layer 614 on the first contact layer 612 for attaching an IC die (e.g., IC die 300 in FIG. 3A) on the first contact layer 612. As shown in exemplary fabrication stage 600(G) in FIG. 6G, the process continues with coupling of a bridge 616 to the first contact layer 612 on the non-conductive paste layer 614 for bonding the die with the substrate interconnects 636C on the first contact layer 612. The bridge 616 may be silicon or organic and have a fine pattern design for die to die connections. The bridge 616 may have sub-micron design capability (silicon) or have a minimum 2 μm fine pattern design capability (organic). As shown in exemplary fabrication stage 600(H) in FIG. 6H, the process continues with the application of a first lamination layer 618 and a second lamination layer 620. As shown in exemplary fabrication stage 600(I) in FIG. 6I, the first lamination layer 618 and the second lamination layer 620 form the first dielectric layer 626(1).

As shown in exemplary fabrication stage 600(J) in FIG. 6J, the process continues with etching a first vertical interconnect pattern 625 to either side of the bridge 616 and extending through the first dielectric layer 626(1) to the first routing layer 640(1). As shown in exemplary fabrication stage 600(K) in FIG. 6K, the process continues with the application of copper in the first vertical interconnect pattern 625 to form a first plurality of vertical interconnects 642C(1), 642P(1) in addition to a second routing layer 628 on the first dielectric layer 626(1). As shown in exemplary fabrication stage 600(L) in FIG. 6L, a second dielectric layer 626(2) is formed on the first dielectric layer 626(1) and a selective etching process is applied to form a second vertical interconnect pattern 632. As shown in exemplary fabrication stage 600(M) in FIG. 6M, the process continues with the application of copper in the second vertical interconnect pattern 632 to form a second plurality of vertical interconnects 642C(2), 642P(2) in addition to a third routing layer 640(3) on the second dielectric layer 626(2). As shown in exemplary fabrication stage 600(N) in FIG. 6N with the application of a third dielectric layer 626(3) on the second dielectric layer 626(2) and. etching of patterns 646C, 646P through the third dielectric layer 626(3) to the routing layer 640(3). As shown in exemplary fabrication stage 600(O) in FIG. 6O, a package 634 formed at this fabrication stage is re-oriented, but it should be understood that this is for illustrative purposes only and the package 634 may remain in the original orientation for the remainder of the manufacturing process. In FIG. 6O, the process continues with the removal of the copper carrier 604 and the copper seed layer 602.

As shown in exemplary fabrication stage 600(P) in FIG. 6P, the process continues with the application of a fourth dielectric layer 626(4) on the first dielectric layer 626(1) and etching of the fourth dielectric layer 626(4) to form a joint pattern 638P and a vacant central region 650 over a second die contact layer 644(2). As shown in exemplary fabrication stage 600(Q) in FIG. 6Q, the process continues with the formation of a bottom interconnect layer 635(2) on the first die contact layer 644(1) and a portion of the first routing layer 640(1) in the central region 650 followed by the formation of a first die contact layer 644(1). The process continues with coupling a first IC die 652 to a portion of the first die contact layer 644(1) and the coupling of a second die 654 to another portion of the first die contact layer 644(1) proximate to the first IC die 652 and horizontally spaced therefrom followed by the application of a first under-fill layer 656.

As shown in exemplary fabrication stage 600(R) in FIG. 6R, the process continues with the attachment of a first package 658 having a third semiconductor die 659 (that can be a memory, a semiconductor die, or an integrated logic chip) and coupled to the first routing layer 640(1) using a second plurality of electrical (e.g., solder) joints 660 formed in the second joint pattern 638P that electrically couples the first package 658 to the first routing layer 640(1). As shown in exemplary fabrication stage 600(S) in FIG. 6S, the process continues with the application of a second under-fill layer 662 between the package 658 and the fourth dielectric layer 626(4). As shown in exemplary fabrication stage 600(T) in FIG. 6T, the process concludes with the formation of a first plurality of external interconnects 620 in the form of solder balls in the patterns 646C, 646P that electrically couple the third routing layer 640(3) to the external interconnects 620.

It should be understood that although the description above mentions a silicon bridge, copper plating, and lead solder material, substitute materials can be used in place of these materials. The substitute materials can include alloys of the above or materials that exhibit similar properties as the above. It is also noted that the terms "top" and "bottom" where used herein are relative terms and are not meant to limit or imply a strict orientation that a "top" referenced element must always be oriented to be above a "bottom" referenced element, and vice versa.

IC packages that include package substrates containing a die region split having one or more metal contacts of electrical traces underneath the IC die(s) thicker in a height direction than other metal contacts of electrical traces in the dielectric layer, and wherein the dielectric layer also include a first dielectric material having a higher thermal conductivity than a second dielectric material, including but not limited to the package substrates in FIGS. 3A-3B and 4, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multi copter.

Figure 7:
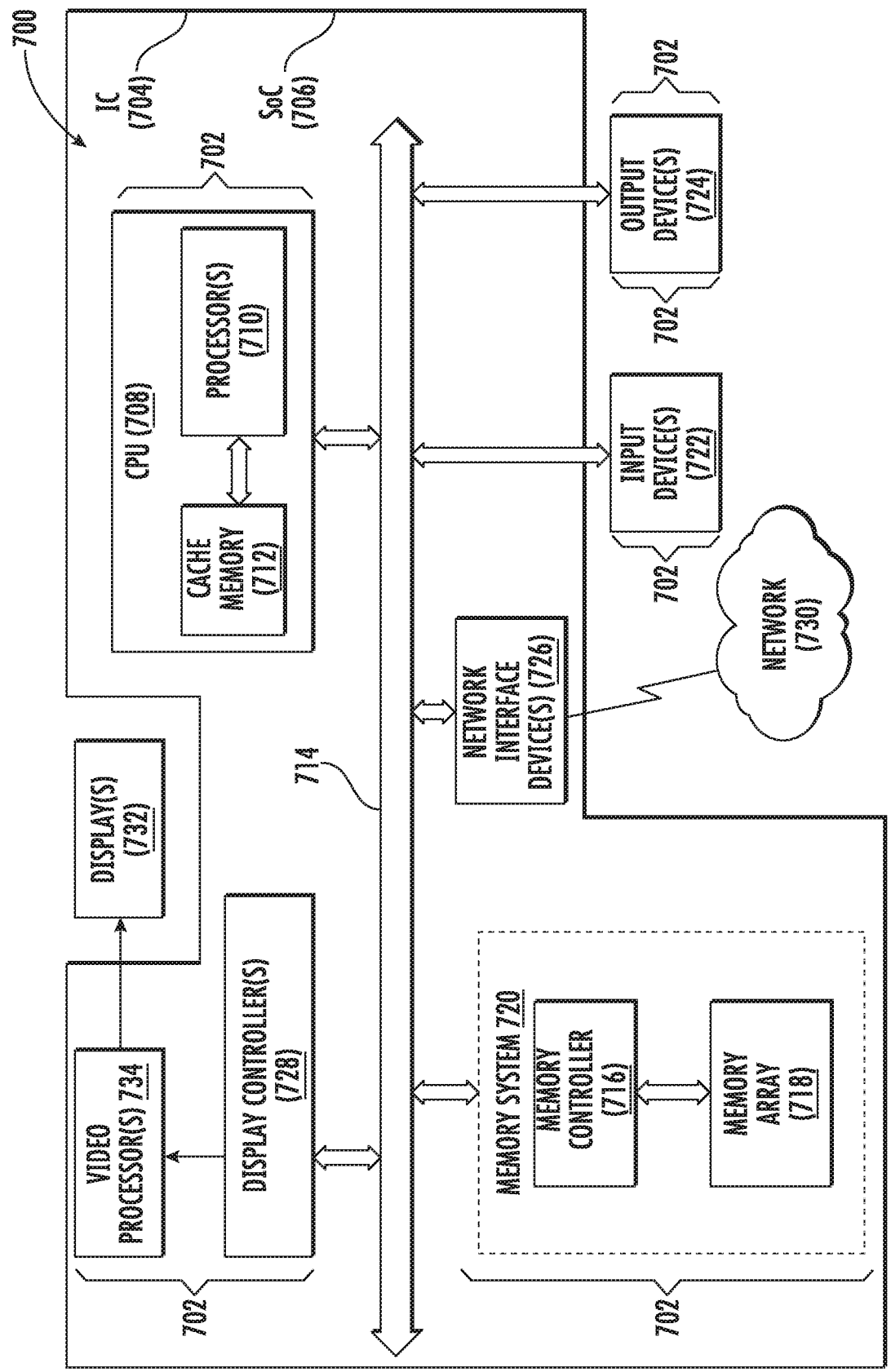
FIG. 7 is a block diagram of an exemplary processor-based system that can be provided in one or more IC die(s) that can be provided in respective IC packages that include package substrates containing a die region split, including but not limited to the package substrates in FIGS. 3A-3B and 4.

In this regard, FIG. 7 illustrates an example of a processor-based system 700 includes circuit that can be provided in an IC package 702 containing a die region split having one or more metal contacts of electrical traces underneath the IC die(s) thicker in a height direction than other metal contacts of electrical traces in the dielectric layer, and wherein the dielectric layer also include a first dielectric material having a higher thermal conductivity than a second dielectric material, including but not limited to the package substrates in FIGS. 3A-3B and 4, and according to any aspects disclosed herein. In this example, the processor-based system 700 may be formed as an IC 704 in an IC package 702 and as a system-on-a-chip (SoC) 706. The processor-based system 700 includes a CPU 708 that includes one or more processors 710, which may also be referred to as CPU cores or processor cores. The CPU 708 may have cache memory 712 coupled to the CPU 708 for rapid access to temporarily stored data. The CPU 708 is coupled to a system bus 714 and can intercouple master and slave devices included in the processor-based system 700. As is well known, the CPU 708 communicates with these other devices by exchanging address, control, and data information over the system bus 714. For example, the CPU 708 can communicate bus transaction requests to a memory controller 716 as an example of a slave device. Although not illustrated in FIG. 7, multiple system buses 714 could be provided, wherein each system bus 714 constitutes a different fabric.

Other master and slave devices can be connected to the system bus 714. As illustrated in FIG. 7, these devices can include a memory system 720 that includes the memory controller 716 and a memory array(s) 718, one or more input devices 722, one or more output devices 724, one or more network interface devices 726, and one or more display controllers 728, as examples. Each of the memory system 720, the one or more input devices 722, the one or more output devices 724, the one or more network interface devices 726, and the one or more display controllers 728 can be provided in the same or different IC packages 702. The input device(s) 722 can include any type of input device, including, but not limited to, input keys, switches, voice processors, etc. The output device(s) 724 can include any type of output device, including, but not limited to, audio, video, other visual indicators, etc. The network interface device(s) 726 can be any device configured to allow exchange of data to and from a network 730. The network 730 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 726 can be configured to support any type of communications protocol desired.

The CPU 708 may also be configured to access the display controller(s) 728 over the system bus 714 to control information sent to one or more displays 732. The display controller(s) 728 sends information to the display(s) 732 to be displayed via one or more video processors 734, which process the information to be displayed into a format suitable for the display(s) 732. The display controller(s) 728 and video processor(s) 734 can be included as ICs in the same or different IC packages 702, and in the same or different IC package 702 containing the CPU 708 as an example. The display(s) 732 can include any type of display, including, but not limited to, a cathode ray tube (CRT), a liquid crystal display (LCD), a plasma display, a light emitting diode (LED) display, etc.

Figure 8:
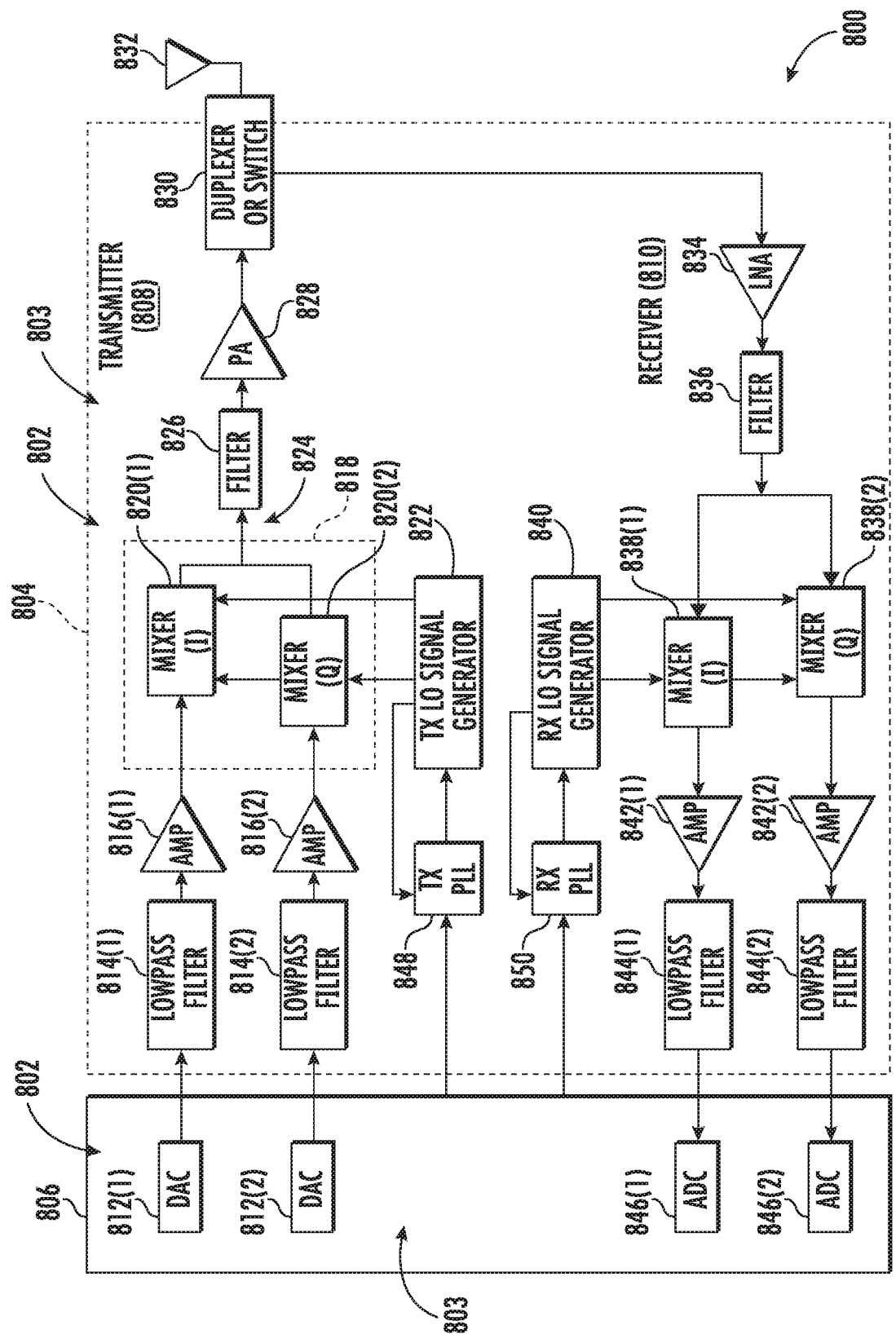
FIG. 8 is a block diagram of an exemplary wireless communications device that includes radio frequency (RF) components formed from one or more IC die(s) that can be provided in respective IC packages that include package substrates containing a die region split, including but not limited to the package substrates in FIGS. 3A-3B and 4.

FIG. 8 illustrates an exemplary wireless communications device 800 that includes radio frequency (RF) components formed from one or more ICs 802, wherein any of the ICs 802 can be included in an IC package 803 containing a die region split having one or more metal contacts of electrical traces underneath the IC die(s) thicker in a height direction than other metal contacts of electrical traces in the dielectric layer, and wherein the dielectric layer also includes a first dielectric material having a higher thermal conductivity than a second dielectric material, including but not limited to the package substrates in FIGS. 3A-3B and 4, and according to any aspects disclosed herein.

The wireless communications device 800 may include or be provided in any of the above referenced devices, as examples. As shown in FIG. 8, the wireless communications device 800 includes a transceiver 804 and a data processor 806. The data processor 806 may include a memory to store data and program codes. The transceiver 804 includes a transmitter 808 and a receiver 810 that support bi-directional communications. In general, the wireless communications device 800 may include any number of transmitters 808 and/or receivers 810 for any number of communication systems and frequency bands. All or a portion of the transceiver 804 may be implemented on one or more analog ICs, RF ICs (RFICs), mixed-signal ICs, etc.

The transmitter 808 or the receiver 810 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 810. In the direct-conversion architecture, a signal is frequency-converted between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes digital-to-analog converters (I)ACs) 812(1), 812(2) for converting digital signals generated by the data processor 806 into the I and Q analog output signals, I and Q output currents, for further processing.

Within the transmitter 808, lowpass filters 814(1), 814(2) filter the I and Q analog output signals, respectively, to remove undesired signals caused by the prior digital-to-analog conversion. Amplifiers (AMP) 816(1), 816(2) amplify the signals from the lowpass filters 814(1), 814(2), respectively, and provide I and Q baseband signals. An upconverter 818 upconverts the I and Q baseband signals with I and Q transmit (TX) local oscillator (LO) signals through mixers 820(1), 820(2) from a TX LO signal generator 822 to provide an upconverted signal 824. A filter 826 filters the upconverted signal 824 to remove undesired signals caused by the frequency upconversion as well as noise in a receive frequency band. A power amplifier (PA) 828 amplifies the upconverted signal 824 from the filter 826 to obtain the desired output power level and provides a transmit RF signal. The transmit RF signal is routed through a duplexer or switch 830 and transmitted via an antenna 832.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated fr©m TX signals. The received RF signal is amplified by the LNA 834 and filtered by a filter 836 to obtain a desired RF input signal. Downconversion mixers 838(1), 838(2) mix the output of the filter 836 with I and Q RX LO signals (i.e., LO_I and LO_Q) from an RX LO signal generator 840 to generate I and Q baseband signals. The I and Q baseband signals are amplified by amplifiers (AMP) 842(1), 842(2) and further filtered by lowpass filters 844(1), 844(2) to obtain I and Q analog input signals, which are provided to the data processor 806. In this example, the data processor 806 includes ADCs 846(1), 846(2) for converting the analog input signals into digital signals to be further processed by the data processor 806.

In the wireless communications device 800 of FIG. 8, the TX LO signal generator 822 generates the I and Q TX LO signals used for frequency upconversion, while the RX LO signal generator 840 generates the I and Q RX LO signals used for frequency downconversion. Each signal is a periodic signal with a particular fundamental frequency. A TX phase-locked loop (PLL) circuit 848 receives timing information from the data processor 806 and generates a control signal used to adjust the frequency and/or phase of the TX LO signals from the TX LO signal generator 822. Similarly, an RX PLL circuit 850 receives timing information from the data processor 806 and generates a control signal used to adjust the frequency and/or phase of the RX LO signals from the RX LO signal generator 840.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC) package, comprising:
    a substrate disposed in a first horizontal plane, the substrate comprising:
        a first dielectric material having a first thermal conductivity;
        a second dielectric material having a second thermal conductivity lower than the first thermal conductivity; and
        a routing layer comprising:
            one or more first metal contacts disposed adjacent to the first dielectric material, the one or more first metal contacts each having a first height in a height direction orthogonal to the first horizontal plane; and
            one or more second metal contacts disposed adjacent to the second dielectric material, the one or more second metal contacts each having a second height in the height direction, the second height less than the first height
            wherein a part of each of the first dielectric material, the second dielectric material, the one or more first metal contacts, and the one or more second metal contacts share a second horizontal plane, the second horizontal plane parallel to the substrate.

2. The IC package of claim 1, wherein the substrate further comprises an interconnect layer comprising one or more substrate interconnects;
    at least one of the one or more first metal contacts electrically coupled to at least one first substrate interconnect among the one or more substrate interconnects; and
    at least one of the one or more second metal contacts electrically coupled to at least one second substrate interconnect among the one or more substrate interconnects.

3. The IC package of claim 1, wherein the substrate comprises:
    a core die region, comprising:
        the first dielectric material having the first thermal conductivity; and
        the one or more first metal contacts in the routing layer comprising one or more substrate core metal contacts in the routing layer and disposed adjacent to the first dielectric material, the one or more substrate core metal contacts each having the first height in the height direction; and
    a peripheral die region disposed outside and adjacent to the core die region, the peripheral die region comprising:
        the second dielectric material having the second thermal conductivity lower than the first thermal conductivity; and
        the one or more second metal contacts comprising one or more substrate peripheral metal contacts in the routing layer and disposed adjacent to the second dielectric material, the one or more substrate peripheral metal contacts each having the second height in the height direction, the second height less than the first height.

4. The IC package of claim 3, wherein the substrate further comprises:
    a second routing layer disposed adjacent to the routing layer;
    a second core die region disposed in alignment with the core die region in the height direction, the second core die region comprising:
        a third dielectric material having a third thermal conductivity; and
        one or more second substrate core metal contacts in the second routing layer and disposed adjacent to the third dielectric material, the one or more second substrate core metal contacts each having a third height in the height direction; and a second peripheral die region disposed in alignment with the peripheral die region in the height direction, the second peripheral die region comprising:
  a fourth dielectric material having a fourth thermal conductivity; and
  one or more second substrate peripheral metal contacts in the second routing layer and disposed adjacent to the fourth dielectric material, the one or more second substrate peripheral metal contacts each having a fourth height in the height direction.

5. The IC package of claim 3, further comprising:
an IC die, comprising:
  the core die region, comprising:
    one or more core circuits; and
    one or more core die interconnects electrically coupled to the one or more core circuits and at least one of the one or more substrate core metal contacts; and
  the peripheral die region disposed outside and adjacent to the core die region, the peripheral die region comprising:
    one or more peripheral circuits; and
    one or more peripheral die interconnects electrically coupled to the one or more peripheral circuits and at least one of the one or more substrate peripheral metal contacts.

6. The IC package of claim 1, wherein the first height is between 15 and 30 micrometers (μm), and the second height is between 5 and 10 μm.

7. The IC package of claim 1, wherein a ratio of the first height to the second height is at least 1.5.

8. The IC package of claim 1, wherein the first thermal conductivity is at least 0.6 Watts per meter (m) Kelvin (K) (W/mK).

9. The IC package of claim 1, wherein the first thermal conductivity is at least 0.1 W/mK greater than the second thermal conductivity.

10. The IC package of claim 1, wherein the first thermal conductivity is between 0.6 and 0.9 W/mK, and the second thermal conductivity is between 0.3 and 0.5 W/mK.

11. The IC package of claim 1, wherein a ratio of the first thermal conductivity to the second thermal conductivity is at least 1.2.

12. The IC package of claim 1, wherein the substrate further comprises:
  a third dielectric material having a third thermal conductivity;
  a fourth dielectric material having a fourth thermal conductivity; and
  a second routing layer comprising:
    one or more third metal contacts disposed adjacent to the third dielectric material, the one or more third metal contacts each having a third height in the height direction; and
    one or more fourth metal contacts disposed adjacent to the fourth dielectric material, the one or more fourth metal contacts each having a fourth height in the height direction.

13. The IC package of claim 12, wherein the third height and the fourth height are the same height.

14. The IC package of claim 12, wherein the third height and the fourth height are different heights.

15. The IC package of claim 12, wherein the third height is equal to the first height, and the fourth height is equal to the second height.

16. The IC package of claim 12, wherein the third dielectric material and the fourth dielectric material are the same dielectric material and wherein the third thermal conductivity is equal to the fourth thermal conductivity.

17. The IC package of claim 12, wherein the third thermal conductivity is greater than the fourth thermal conductivity.

18. The IC package of claim 1, wherein the dielectric layer further comprises:
  one or more first vertical interconnects each in contact with a first metal contact among the one or more first metal contacts; and
  one or more second vertical interconnects each in contact with a second metal contact among the one or more second metal contacts.

19. The IC package of claim 2, wherein:
  the substrate comprises a top surface and a bottom surface;
  the one or more substrate interconnects in the interconnect layer comprises:
    one or more first substrate interconnects exposed through the top surface of the substrate; and
    one or more second substrate interconnects exposed through the top surface of the substrate;
  the at least one of the one or more first metal contacts is electrically coupled to at least one of the one or more first substrate interconnects; and
  the at least one of the one or more second metal contacts is electrically coupled to at least one of the one or more second substrate interconnects.

20. The IC package of claim 2, wherein the substrate further comprises a bottom interconnect layer comprising:
  one or more third substrate interconnects, at least one of the one or more third substrate interconnects electrically coupled to at least one of the one or more first metal contacts; and
  one or more fourth substrate interconnects, at least one of the one or more fourth substrate interconnects electrically coupled to at least one of the one or more second metal contacts.

21. The IC package of claim 1, further comprising:
an IC die, comprising:
  one or more circuits; and
  one or more die interconnects;
    at least one of the one or more die interconnects electrically coupled to at least one of the one or more circuits and at least one metal contact among the one or more first metal contacts and one or more second metal contacts.

22. The IC package of claim 1 integrated into a device selected from the group consisting of: a set top box; an entertainment unit; a navigation device; a communications device;
  a fixed location data unit; a mobile location data unit; a global positioning system (GPS) device; a mobile phone; a cellular phone; a smart phone; a session initiation protocol (SIP) phone; a tablet;
  a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD)

player; a portable digital video player; an automobile; a vehicle component; avionics systems; a drone; and a multicopter.

23. A method of fabricating a package substrate for an integrated circuit (IC) package, comprising forming a substrate disposed in a first horizontal plane, comprising:
   forming a dielectric layer, comprising:
      forming a first dielectric material having a first thermal conductivity;
      forming a second dielectric material having a second thermal conductivity lower than the first thermal conductivity; and
   forming a routing layer comprising:
      forming one or more first metal contacts adjacent to the first dielectric material, the one or more first metal contacts each having a first height in a height direction orthogonal to the first horizontal plane; and
      forming one or more second metal contacts adjacent to the second dielectric material, the one or more second metal contacts each having a second height in the height direction, the second height less than the first height,
         wherein at least a part of each of the first dielectric material, the second dielectric material, the one or more first metal contacts, and the one or more second metal contacts share a second horizontal plane, the second horizontal plane parallel to the substrate.

24. The method of claim 23, wherein forming the substrate further comprises forming an interconnect layer comprising:
   forming one or more substrate interconnects comprising one or more substrate core interconnects and one or more substrate peripheral interconnects; and
   further comprising:
      electrically coupling at least one of the one or more first metal contacts to at least one first substrate interconnect among the one or more substrate interconnects; and
      electrically coupling at least one of the one or more second metal contacts to at least one second substrate interconnect among the one or more substrate interconnects.

25. The method of claim 23, wherein:
   forming the first dielectric material further comprises forming the first dielectric material in a core die region;
   forming the second dielectric material further comprises forming the second dielectric material in a peripheral die region disposed outside and adjacent to the core die region;
   forming the one or more first metal contacts comprises forming one or more substrate core metal contacts adjacent to the first dielectric material, the one or more substrate core metal contacts each having the first height in the height direction orthogonal to the horizontal plane; and
   forming the one or more second metal contacts comprises forming one or more substrate peripheral metal contacts adjacent to the second dielectric material, the one or more substrate peripheral metal contacts each having the second height in the height direction, the second height less than the first height.

26. The method of claim 25, further comprising forming an IC die, comprising:
   forming one or more core circuits in the core die region;
   forming one or more core die interconnects electrically coupled to the one or more core circuits and at least one of the one or more substrate core metal contacts in the core die region;
   forming one or more peripheral circuits in the peripheral die region disposed outside and adjacent to the core die region; and
   forming one or more peripheral die interconnects electrically coupled to the one or more peripheral circuits and at least one of the one or more substrate peripheral metal contacts in the peripheral die region.

27. The method of claim 23, wherein forming the routing layer further comprises:
   forming a routing layer pattern in the routing layer comprising one or more first openings of the first height and one or more second openings of the second height;
   disposing a metal material in the one or more first openings to form the one or more first metal contacts of the first height; and
   disposing a metal material in the one or more second openings to form the one or more second metal contacts of the second height.

28. The method of claim 23, wherein forming the routing layer further comprises:
   forming one or more first vertical interconnects each in contact with a first metal contact among the one or more first metal contacts; and
   forming one or more second vertical interconnects each in contact with a second metal contact among the one or more second metal contacts.

29. The method of claim 23, further comprising forming an IC die, comprising:
   forming one or more circuits;
   forming one or more die interconnects electrically coupled to the one or more circuits and at least one of the one or more first metal contacts; and
   forming one or more die interconnects electrically coupled to the one or more circuits and at least one of the one or more second metal contacts.

* * * * *